(12) United States Patent
Nakaki

(10) Patent No.: US 10,903,233 B2
(45) Date of Patent: Jan. 26, 2021

(54) SEMICONDUCTOR MEMORY DEVICE AND MANUFACTURING METHOD OF SEMICONDUCTOR MEMORY DEVICE

(71) Applicant: Toshiba Memory Corporation, Minato-ku (JP)

(72) Inventor: Hiroshi Nakaki, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/275,378

(22) Filed: Feb. 14, 2019

(65) Prior Publication Data

US 2020/0075621 A1 Mar. 5, 2020

(30) Foreign Application Priority Data

Sep. 5, 2018 (JP) .................................. 2018-166072

(51) Int. Cl.

| H01L 27/115 | (2017.01) |
|---|---|
| H01L 27/11582 | (2017.01) |
| H01L 27/1157 | (2017.01) |
| H01L 21/02 | (2006.01) |
| H01L 21/3215 | (2006.01) |
| H01L 21/3213 | (2006.01) |

(Continued)

(52) U.S. Cl.
CPC .. *H01L 27/11582* (2013.01); *H01L 21/02238* (2013.01); *H01L 21/31111* (2013.01); *H01L 21/32134* (2013.01); *H01L 21/32155* (2013.01); *H01L 27/1157* (2013.01); *H01L 29/40117* (2019.08)

(58) Field of Classification Search
CPC ......... H01L 27/11582; H01L 29/40117; H01L 21/02238; H01L 21/31111; H01L 21/32134; H01L 21/32155; H01L 27/1157

See application file for complete search history.

(56) References Cited

U.S. PATENT DOCUMENTS

| 8,952,446 B2 | 2/2015 | Tanaka |
|---|---|---|
| 9,054,132 B2 | 6/2015 | Sato et al. |
| 9,070,589 B2 | 6/2015 | Kawai et al. |

(Continued)

FOREIGN PATENT DOCUMENTS

| JP | 2014-11389 | 1/2014 |
|---|---|---|
| JP | 2014-175348 | 9/2014 |

(Continued)

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

A semiconductor device according to an embodiment includes first conductors, a second conductor, a first semiconductor, a multi-layered body, and a third conductor. The second conductor is provided above the first conductors. The multi-layered body is provided between the first semiconductor and the first conductors, and between the first semiconductor and the second conductor. The third conductor is provided between the multi-layered body and the second conductor. The first semiconductor includes a first portion facing an uppermost first conductor and a second portion facing the second conductor. The first semiconductor is continuous at least from the first portion to the second portion.

15 Claims, 38 Drawing Sheets

(51) Int. Cl.
*H01L 21/311* (2006.01)
*H01L 21/28* (2006.01)

(56) References Cited

U.S. PATENT DOCUMENTS

| | | | |
|---|---|---|---|
| 10,290,650 B1* | 5/2019 | Iwai | H01L 27/11556 |
| 2010/0207187 A1* | 8/2010 | Aoki | H01L 29/40114 |
| | | | 257/316 |
| 2016/0071593 A1 | 3/2016 | Hashimoto | |
| 2019/0027489 A1* | 1/2019 | Orimoto | H01L 21/76877 |

FOREIGN PATENT DOCUMENTS

| | | |
|---|---|---|
| JP | 2014-183224 | 9/2014 |
| TW | I575522 B | 3/2017 |

* cited by examiner

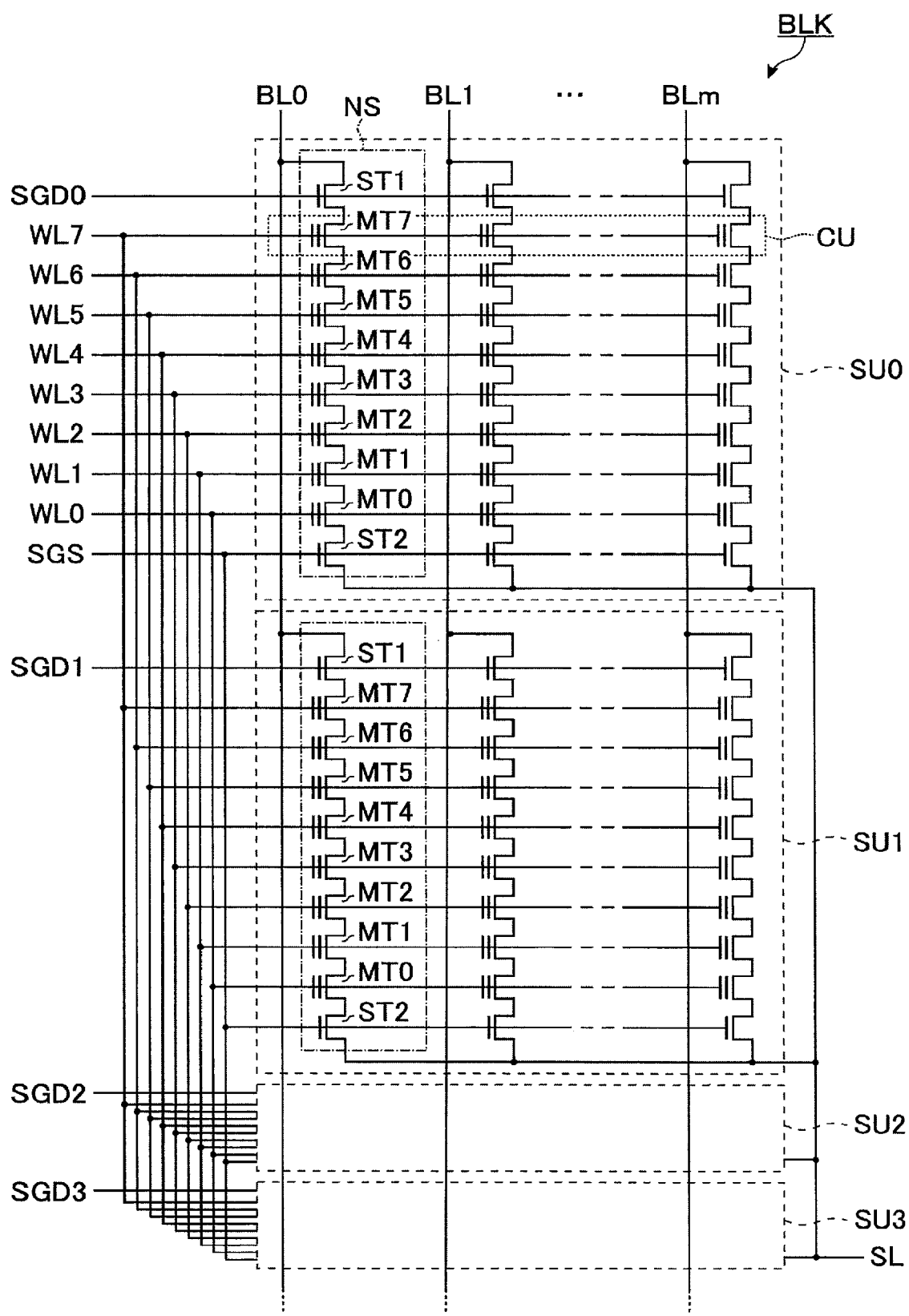
F I G. 2

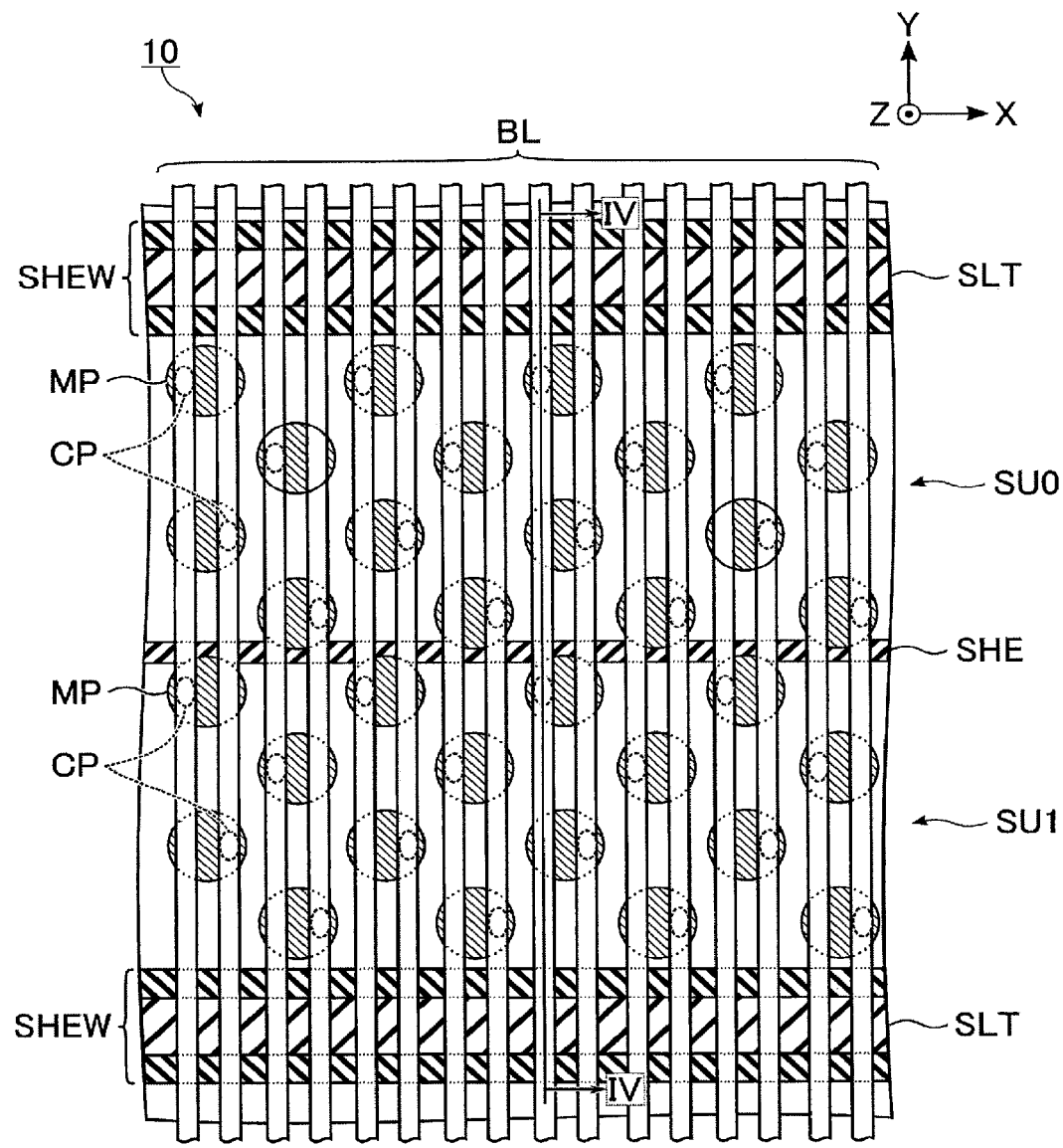
F I G. 3

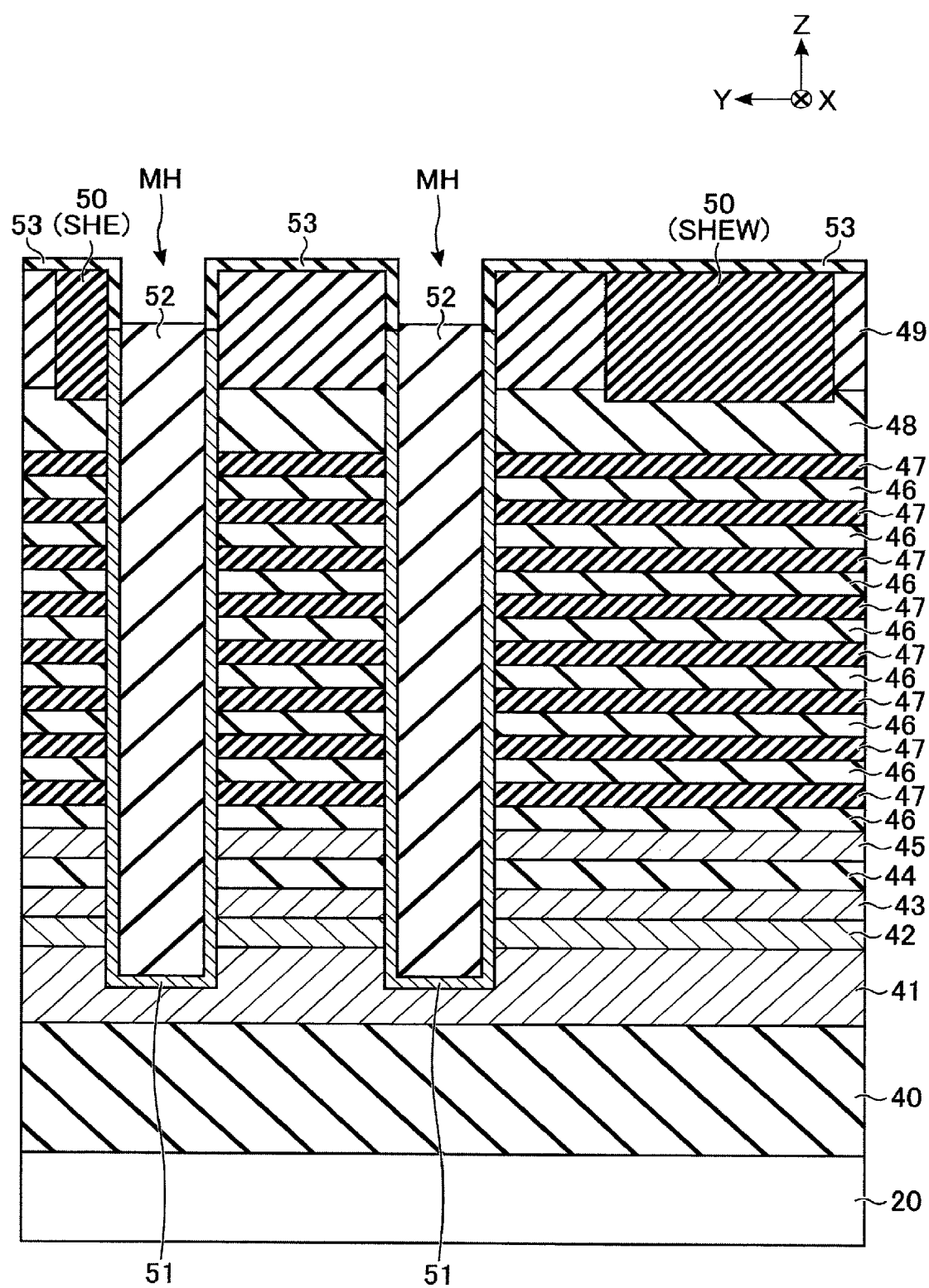
F I G. 11

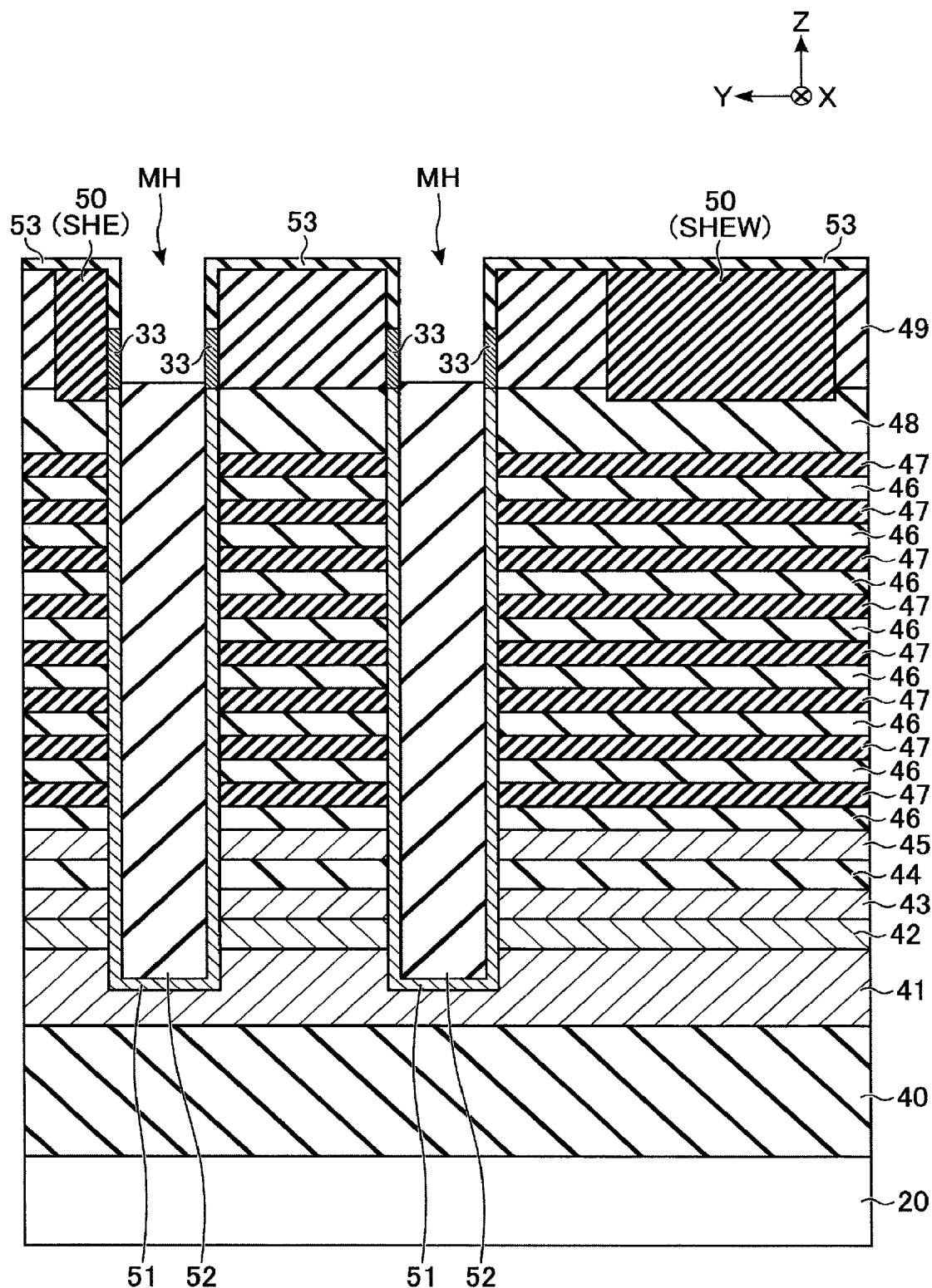
F I G. 12

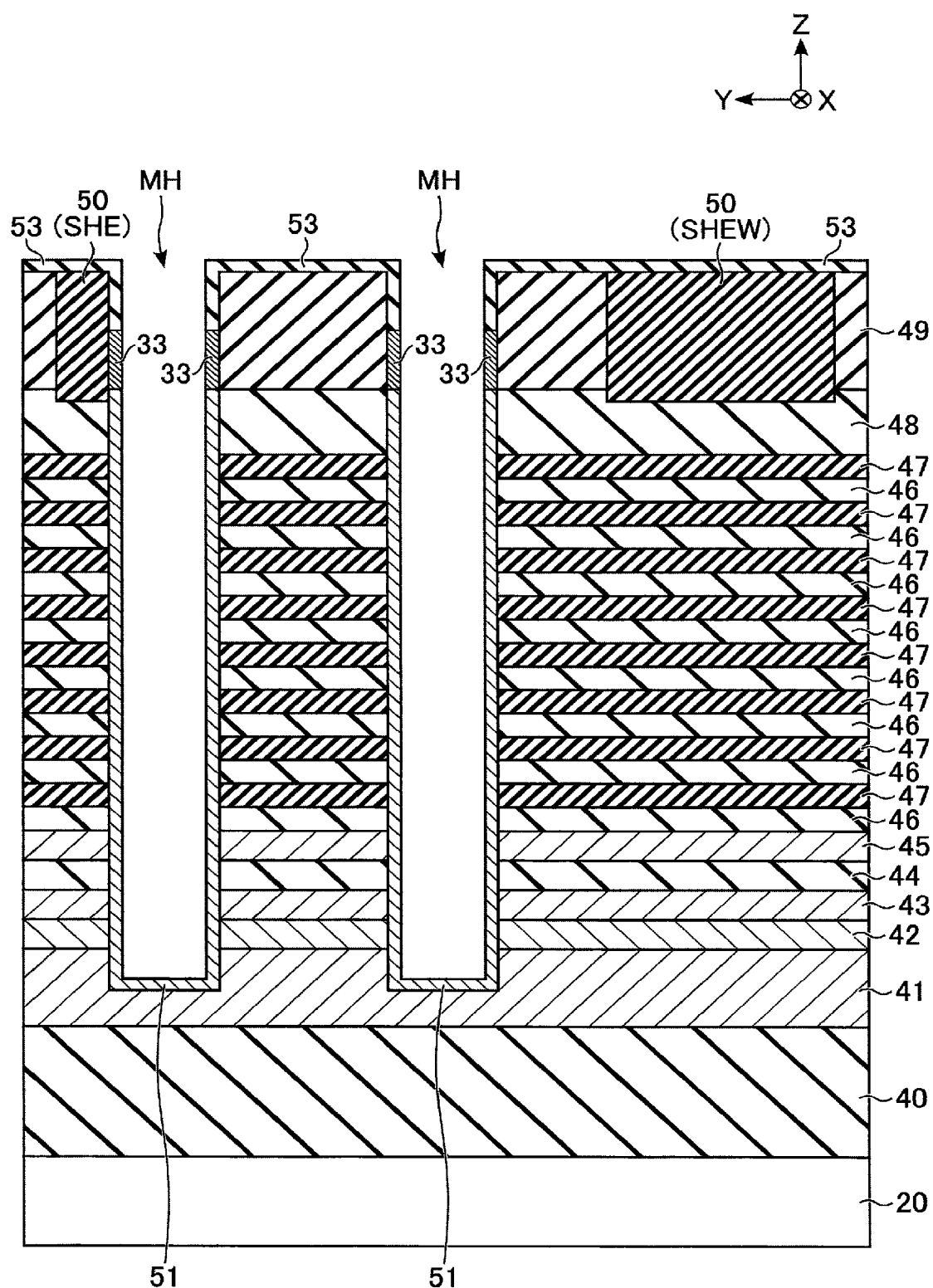
F I G. 13

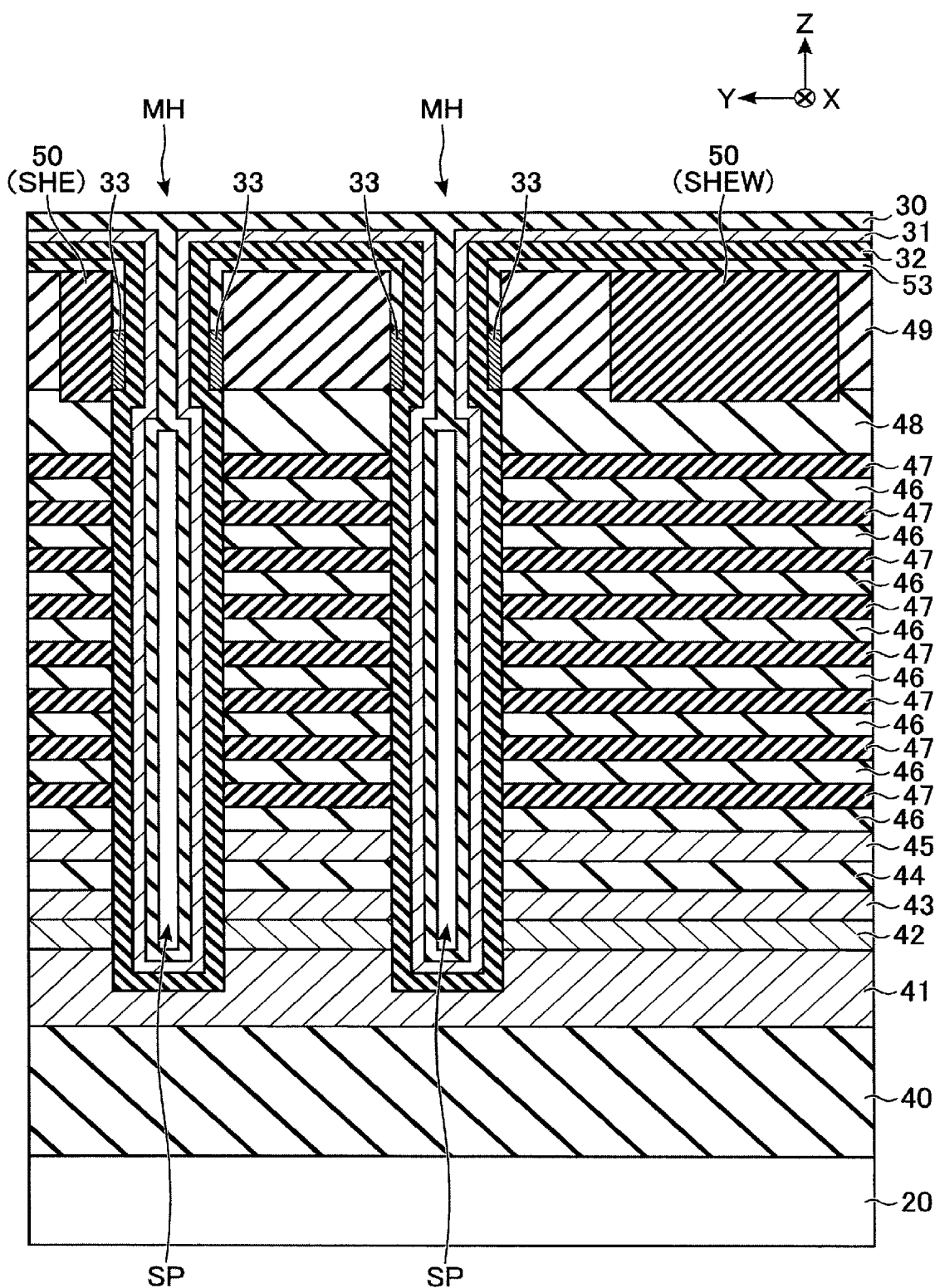
F I G. 14

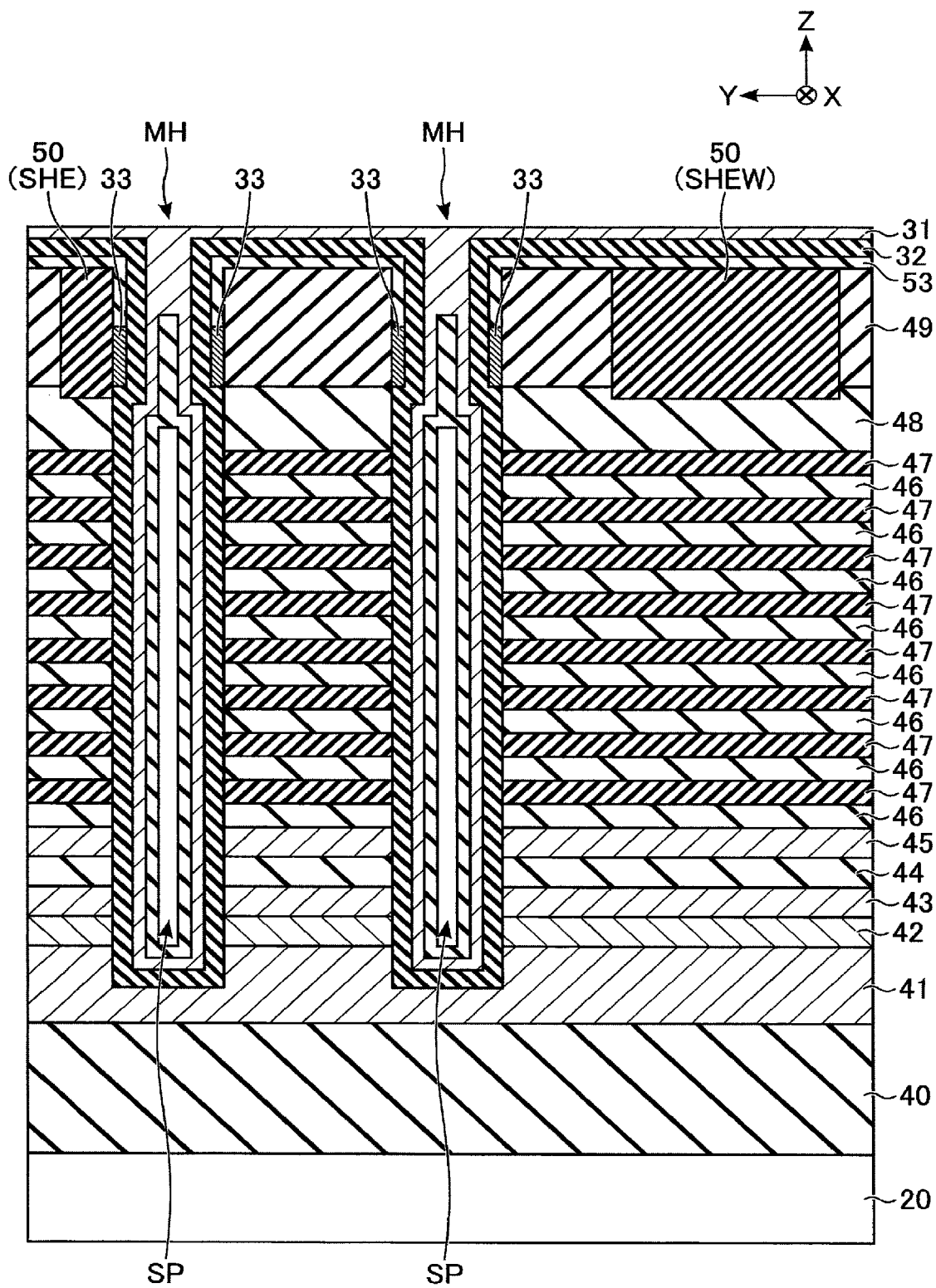
F I G. 15

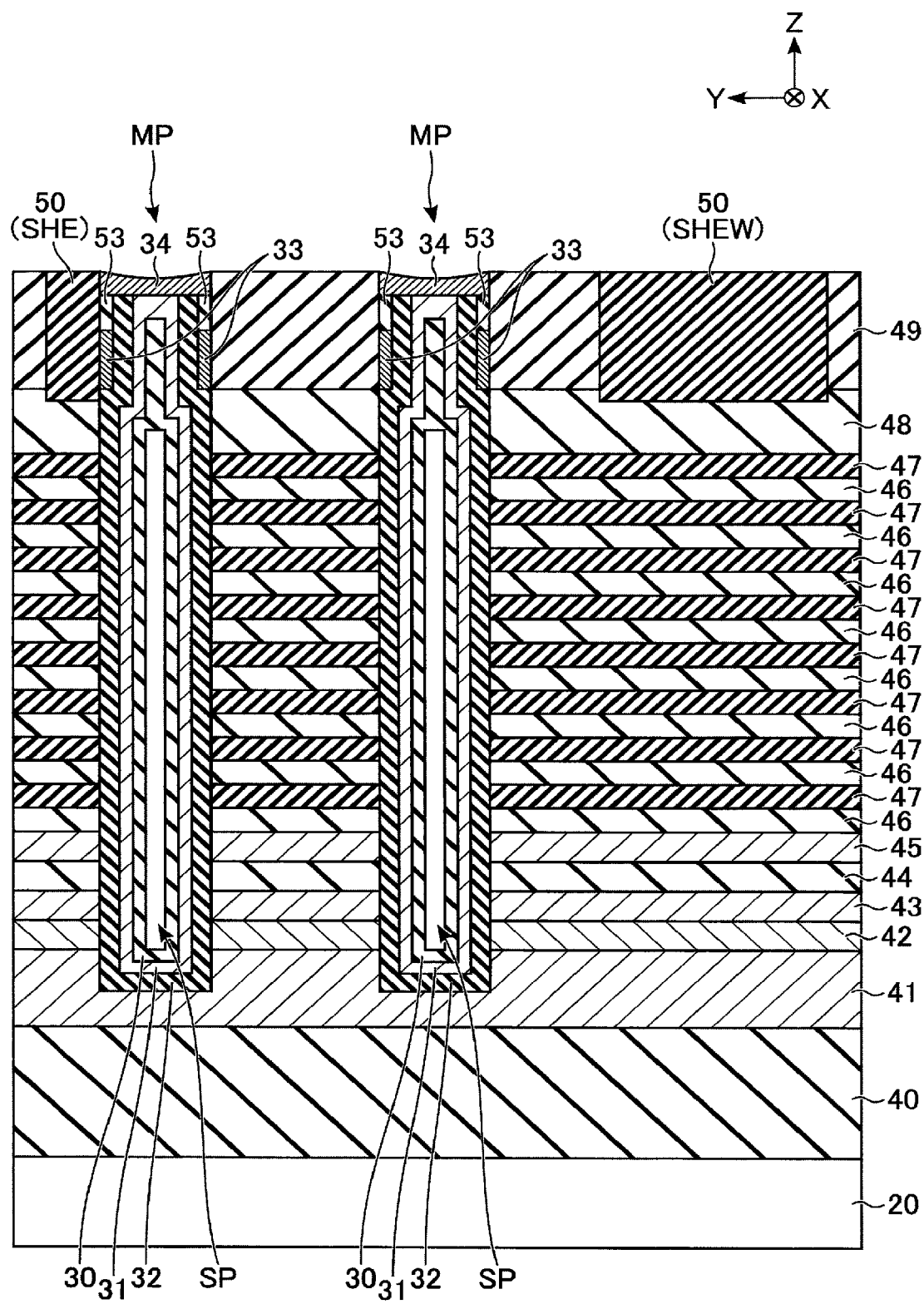
F I G. 16

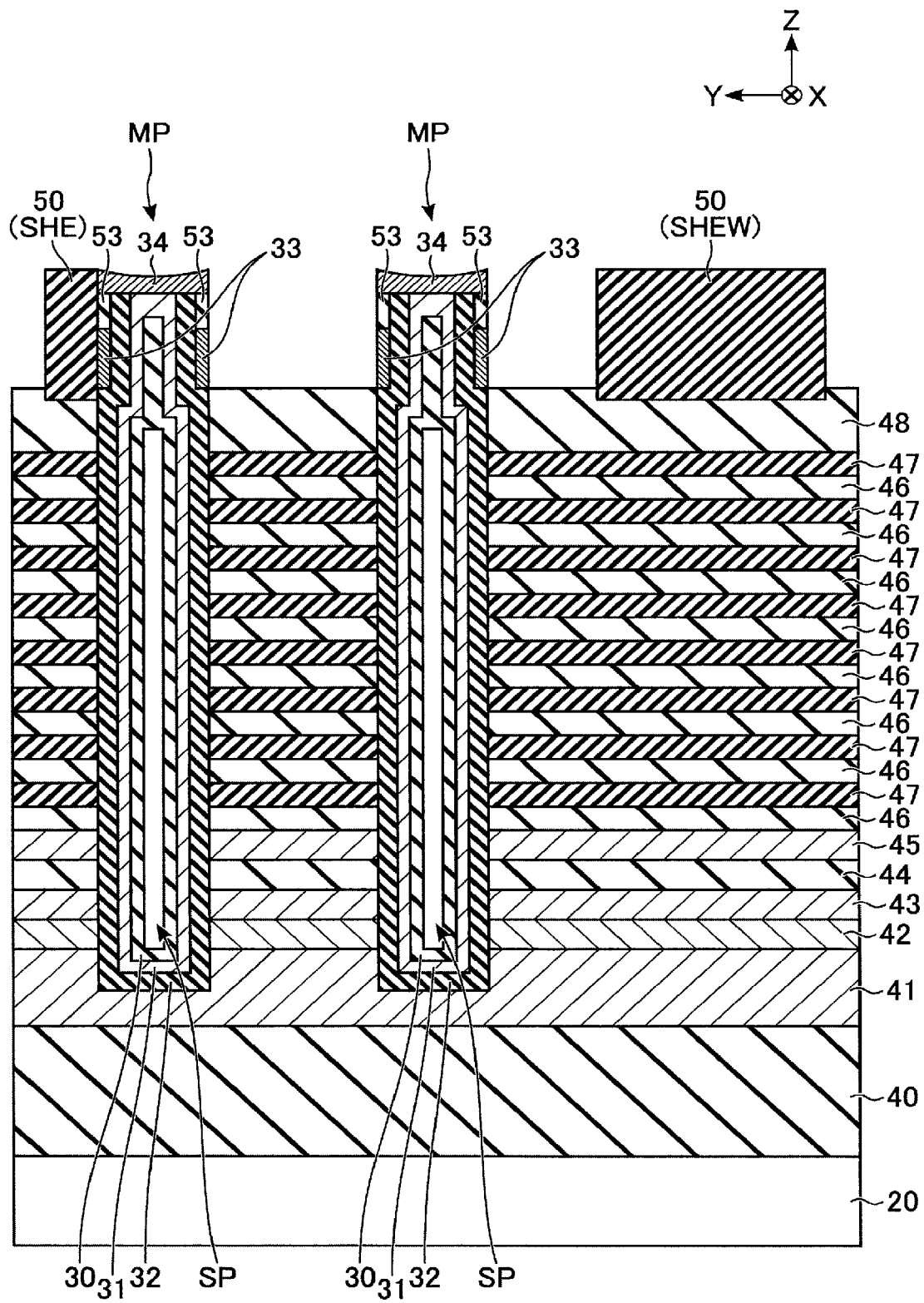
F I G. 17

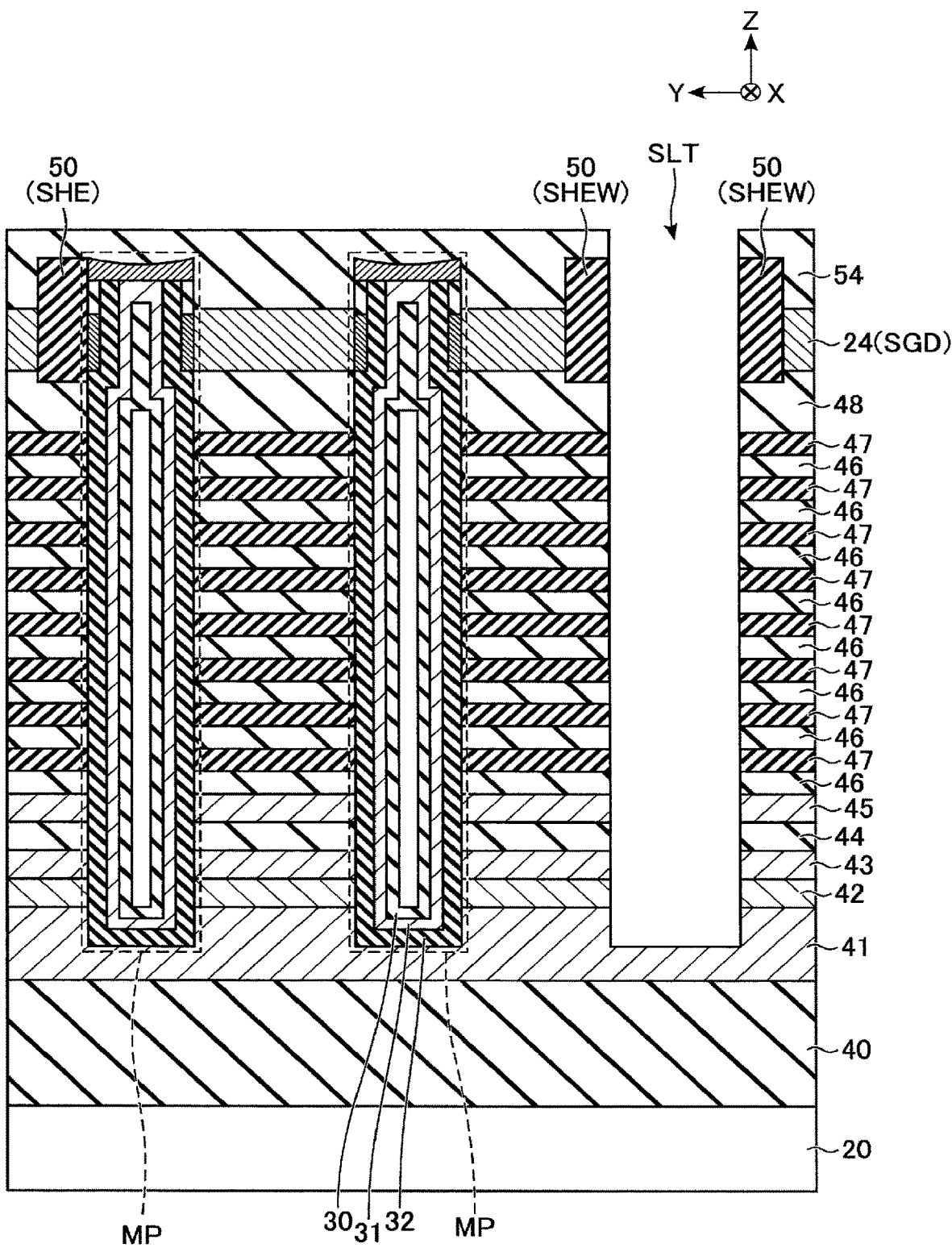
F I G. 18

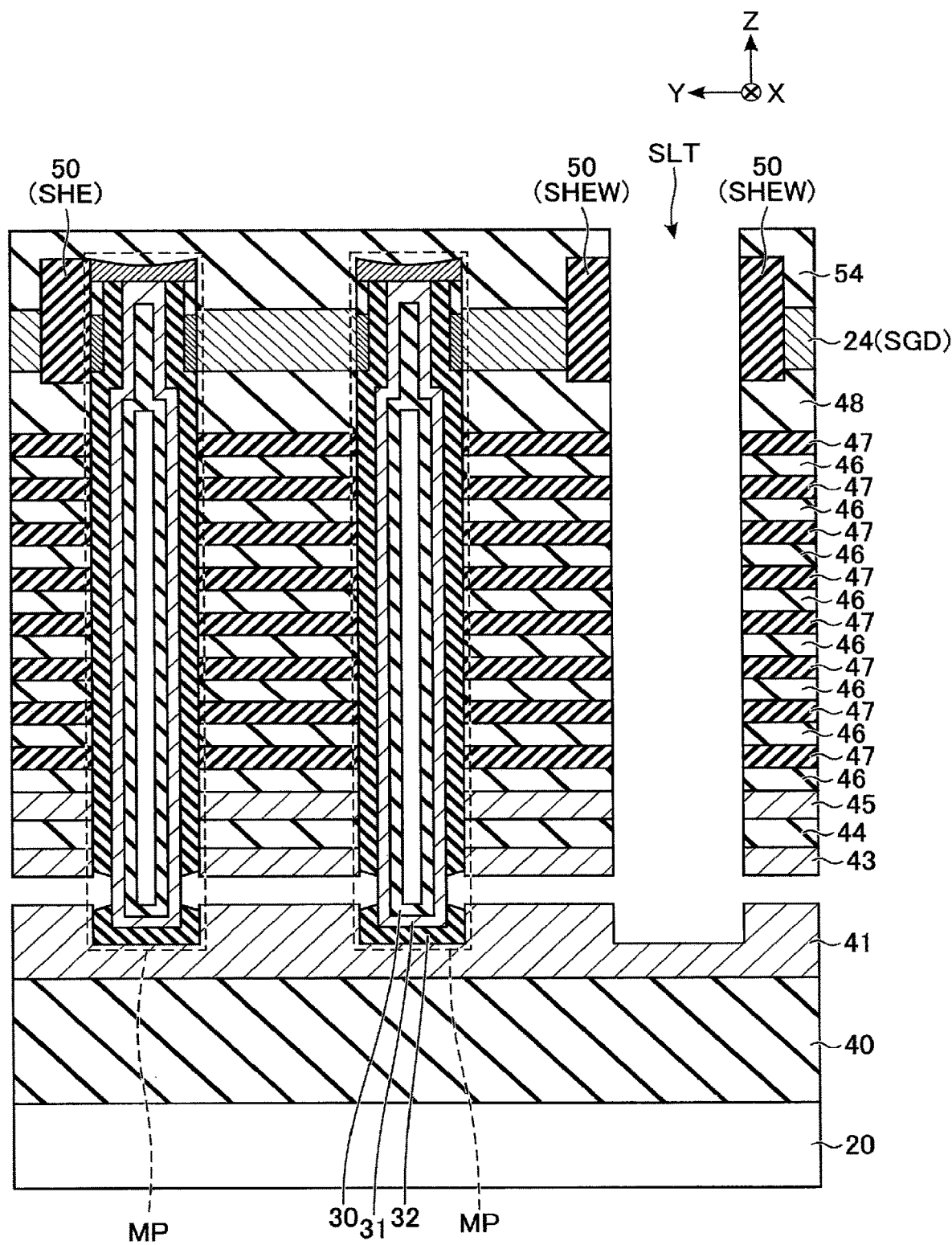
F I G. 19

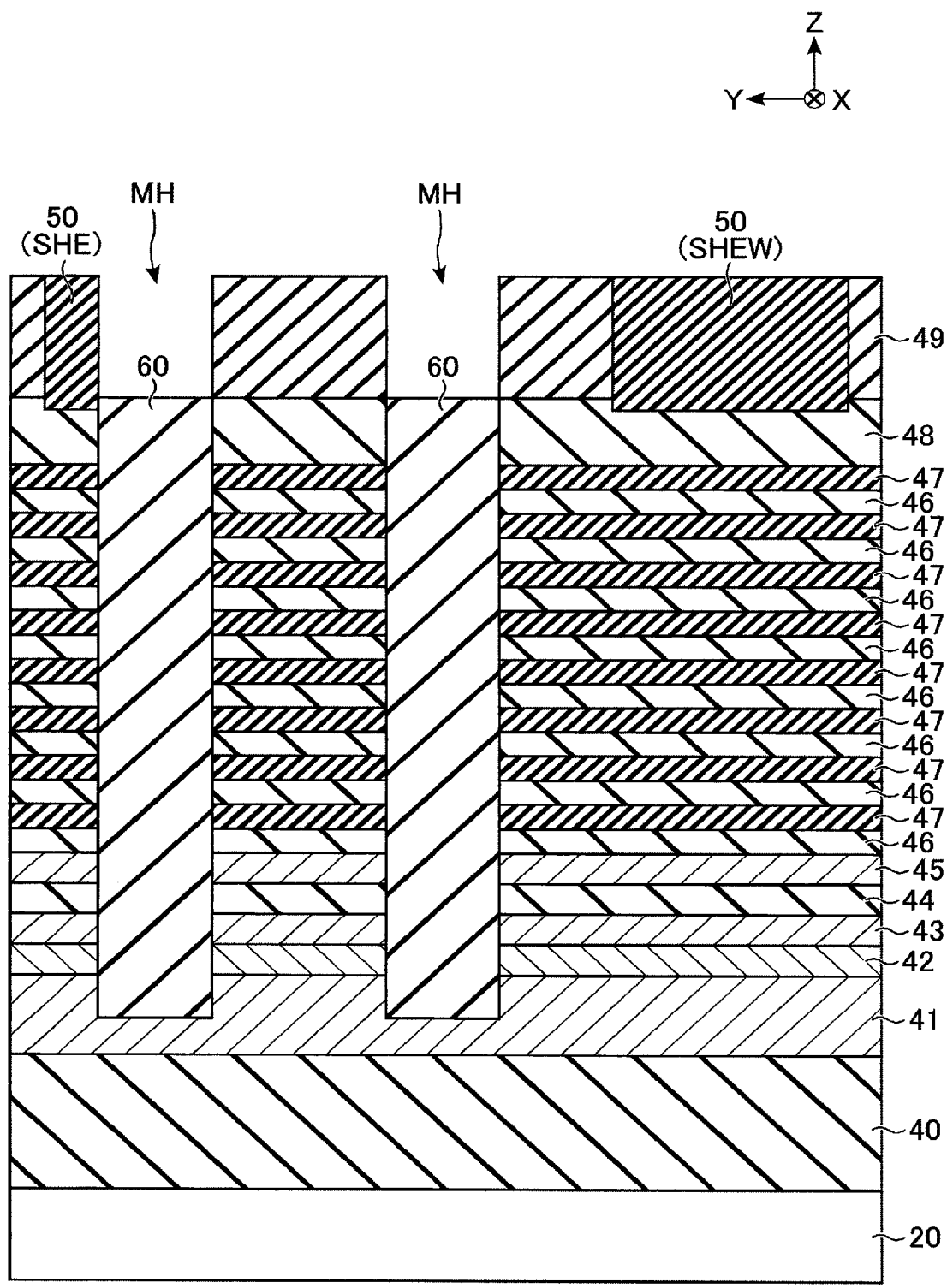
F I G. 24

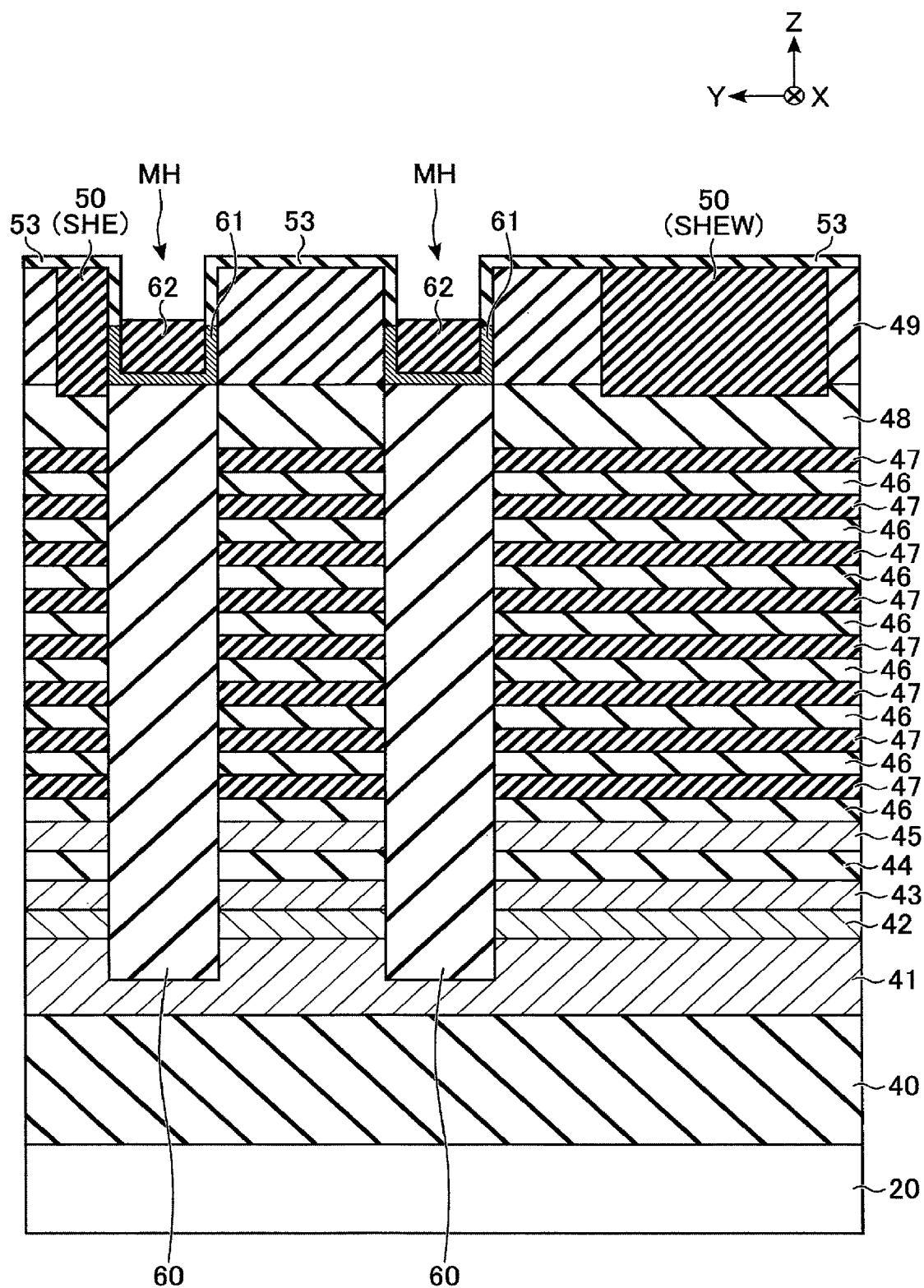
F I G. 25

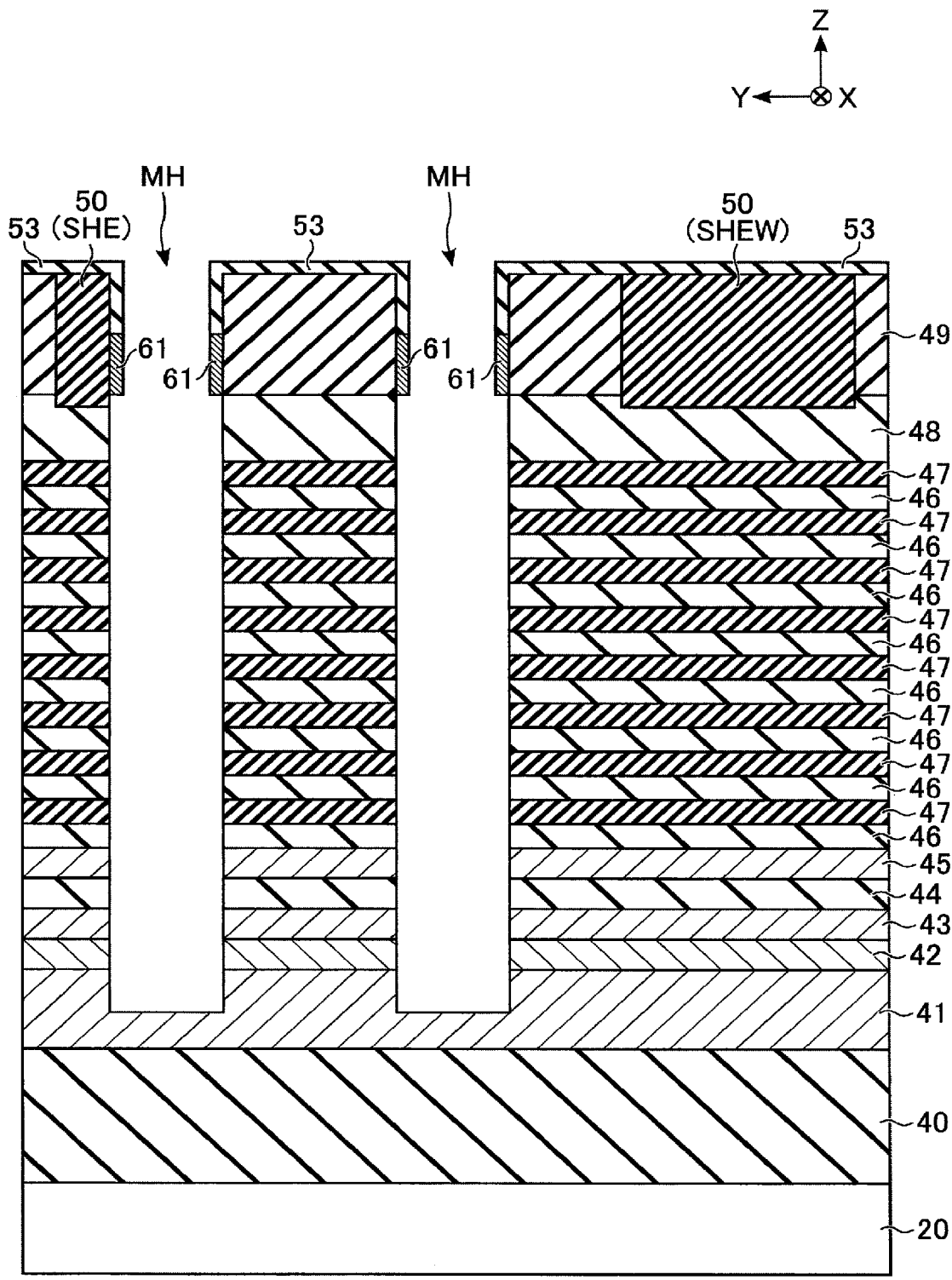
F I G. 26

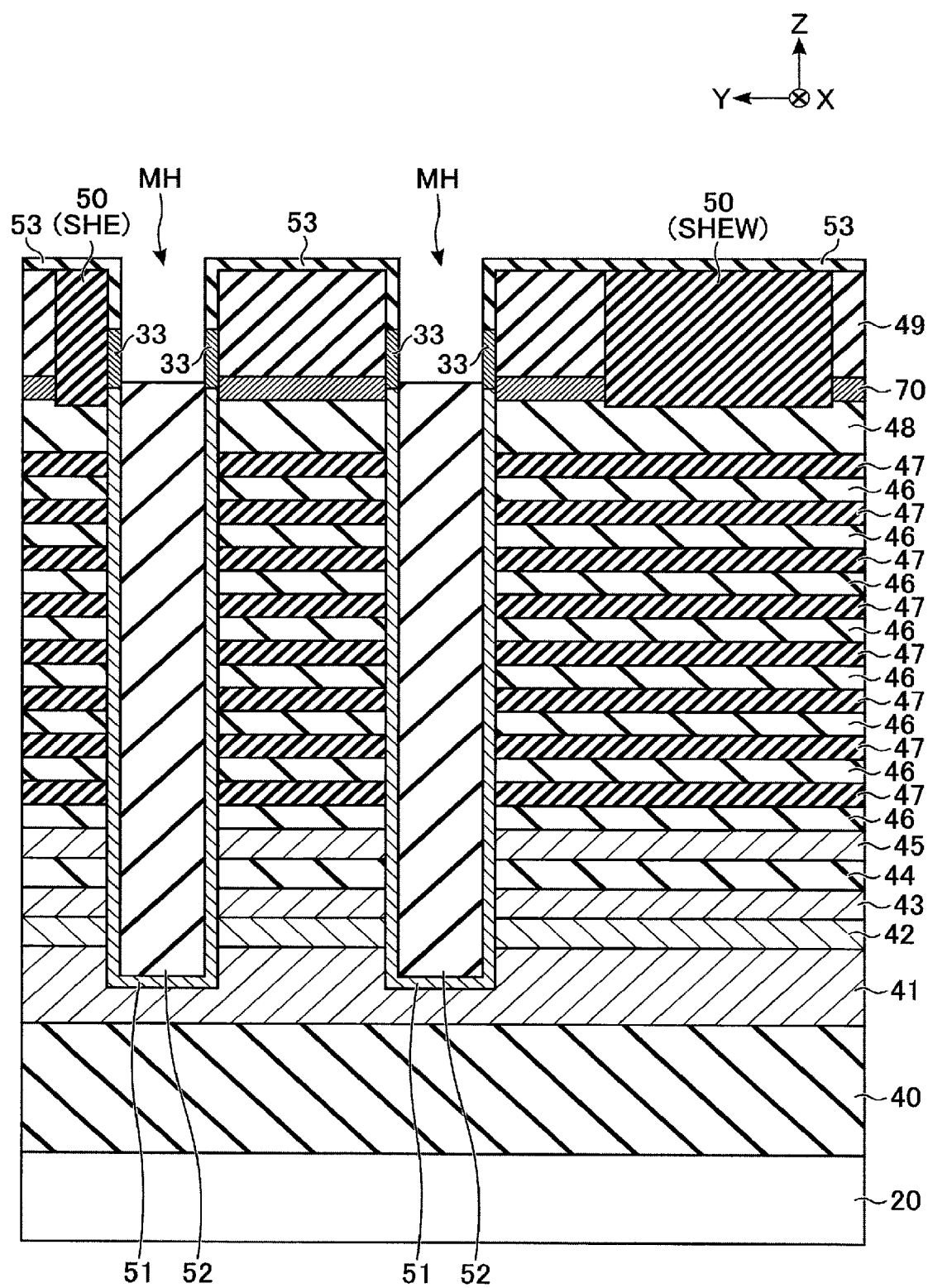
F I G. 31

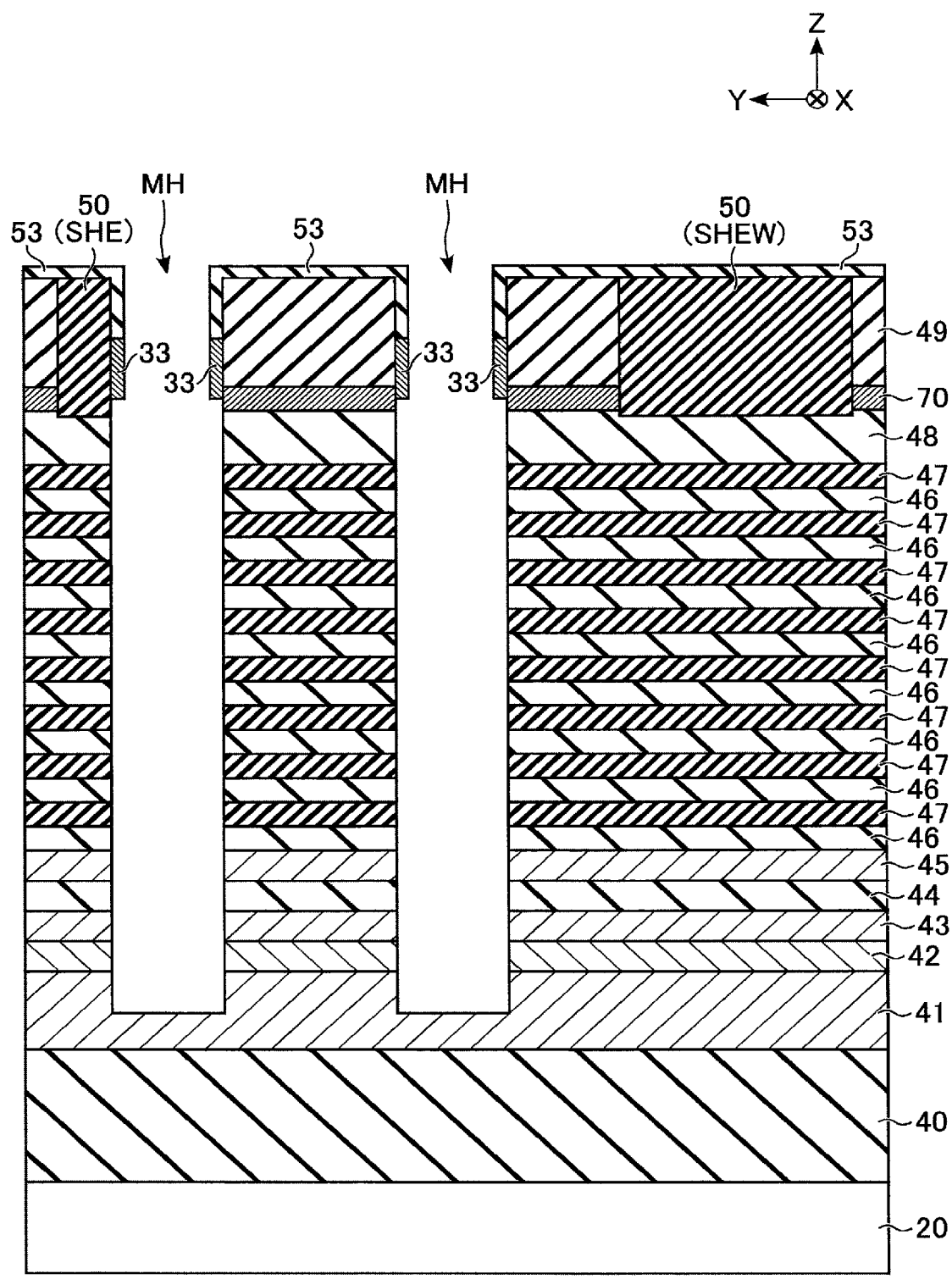
F I G. 32

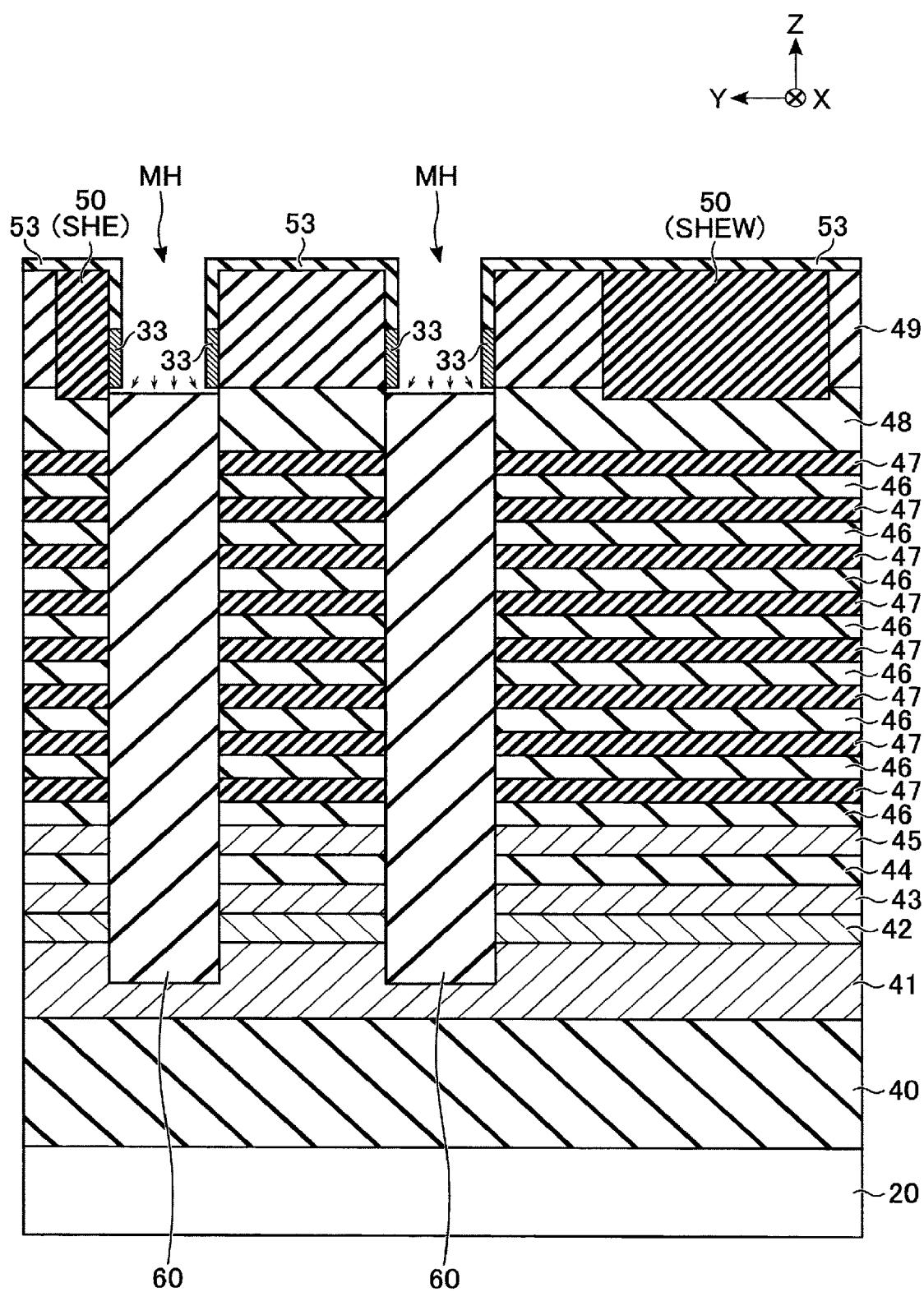
F I G. 35

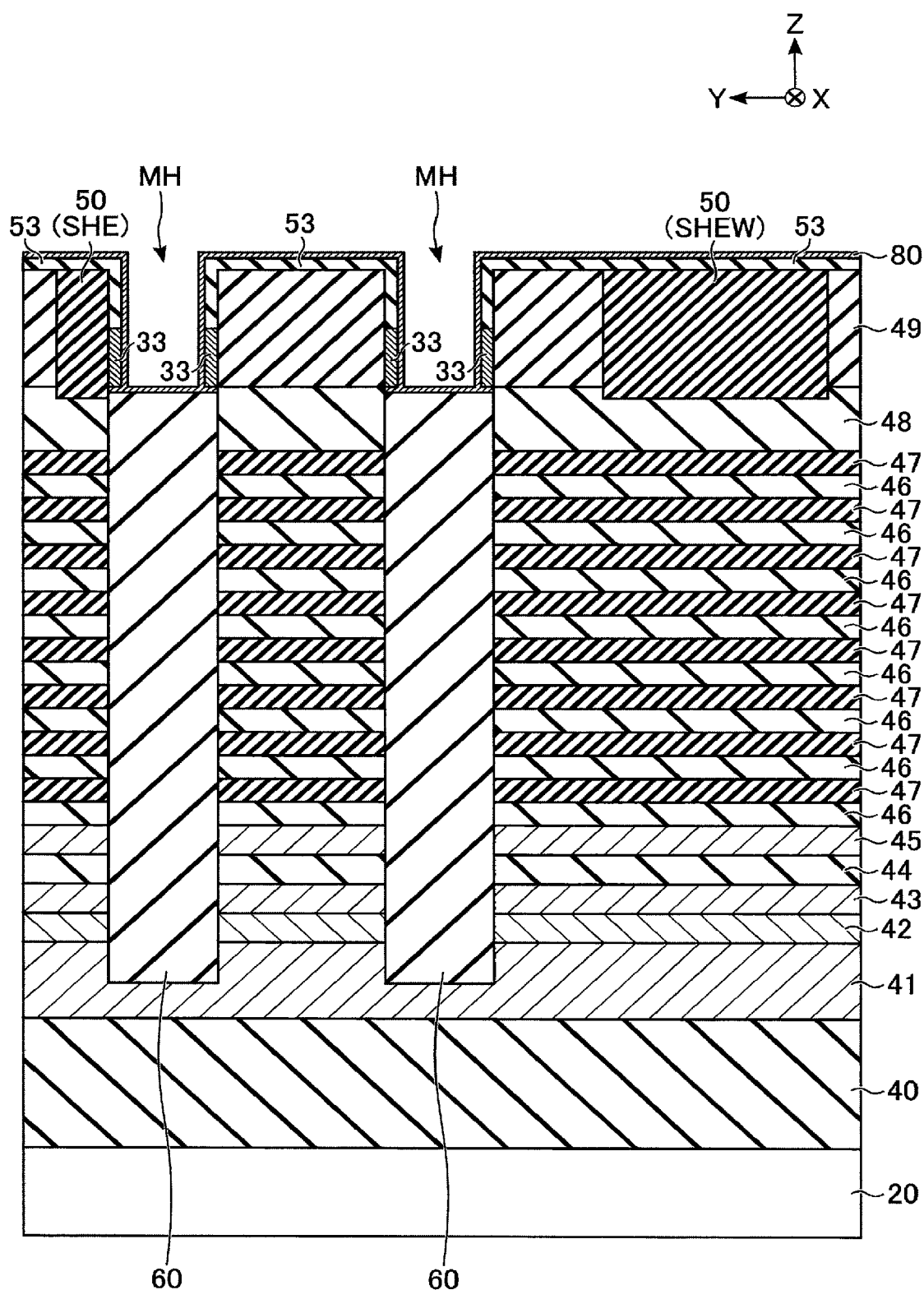
F I G. 36

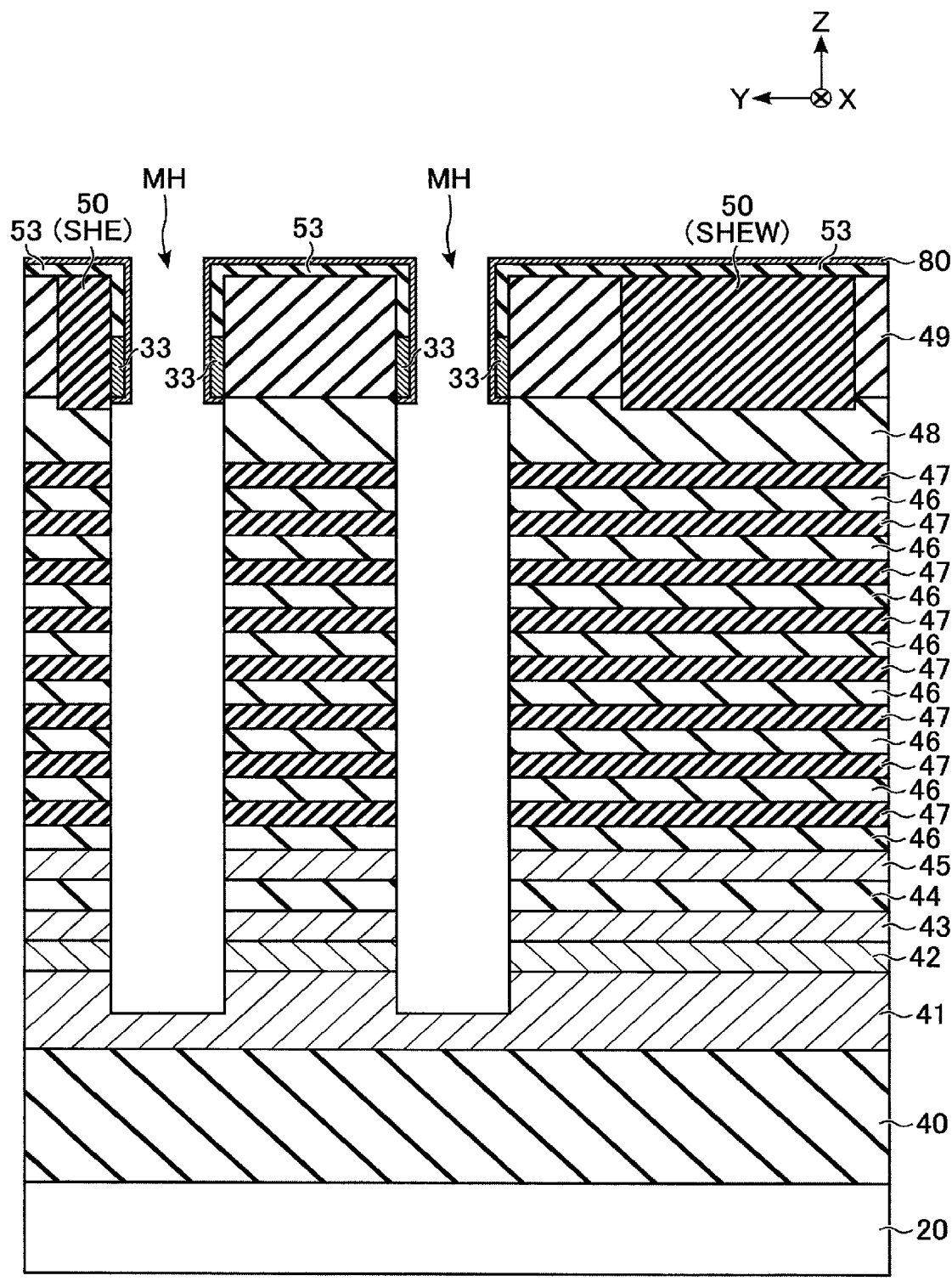
F I G. 37

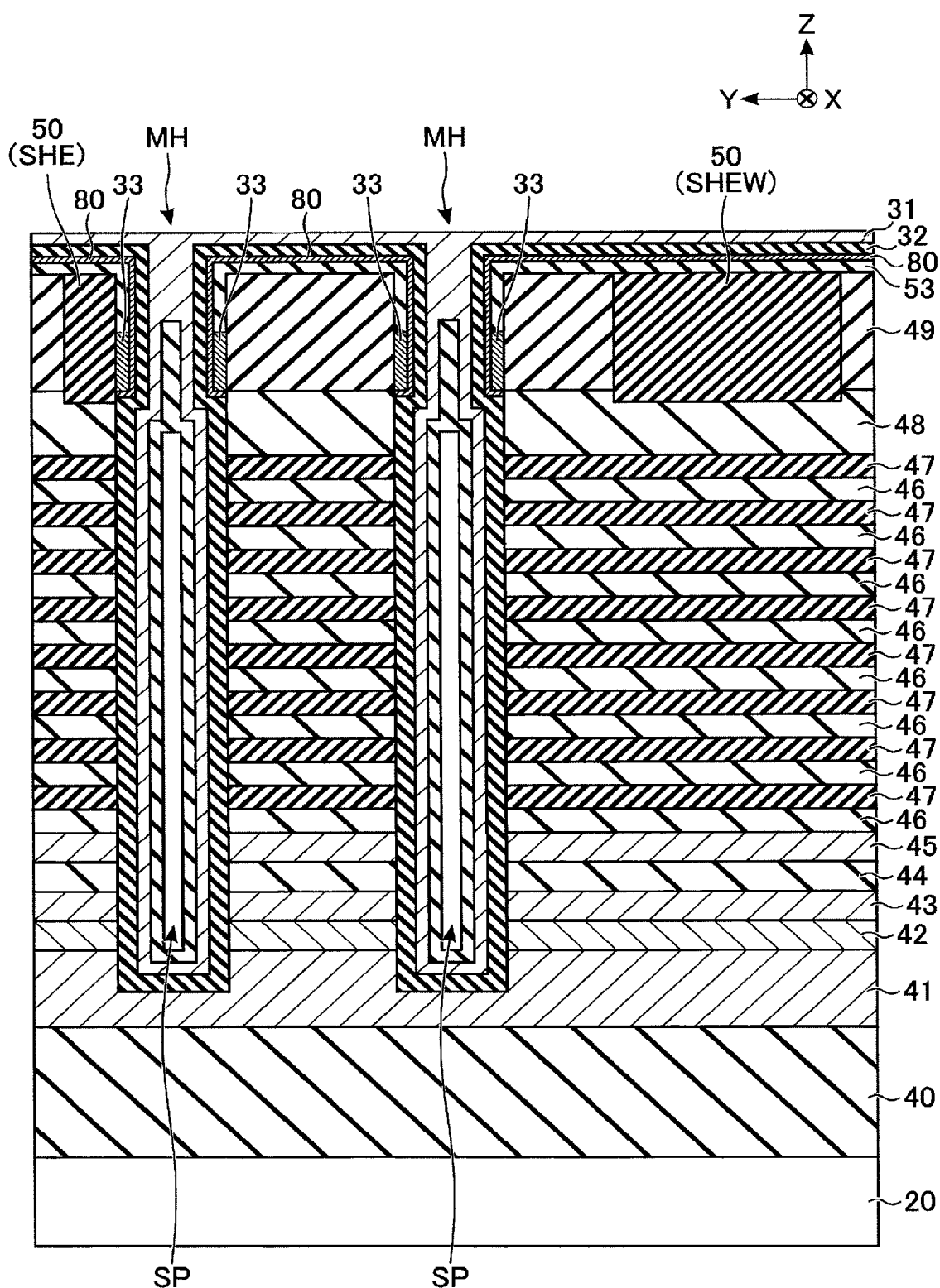
F I G. 38

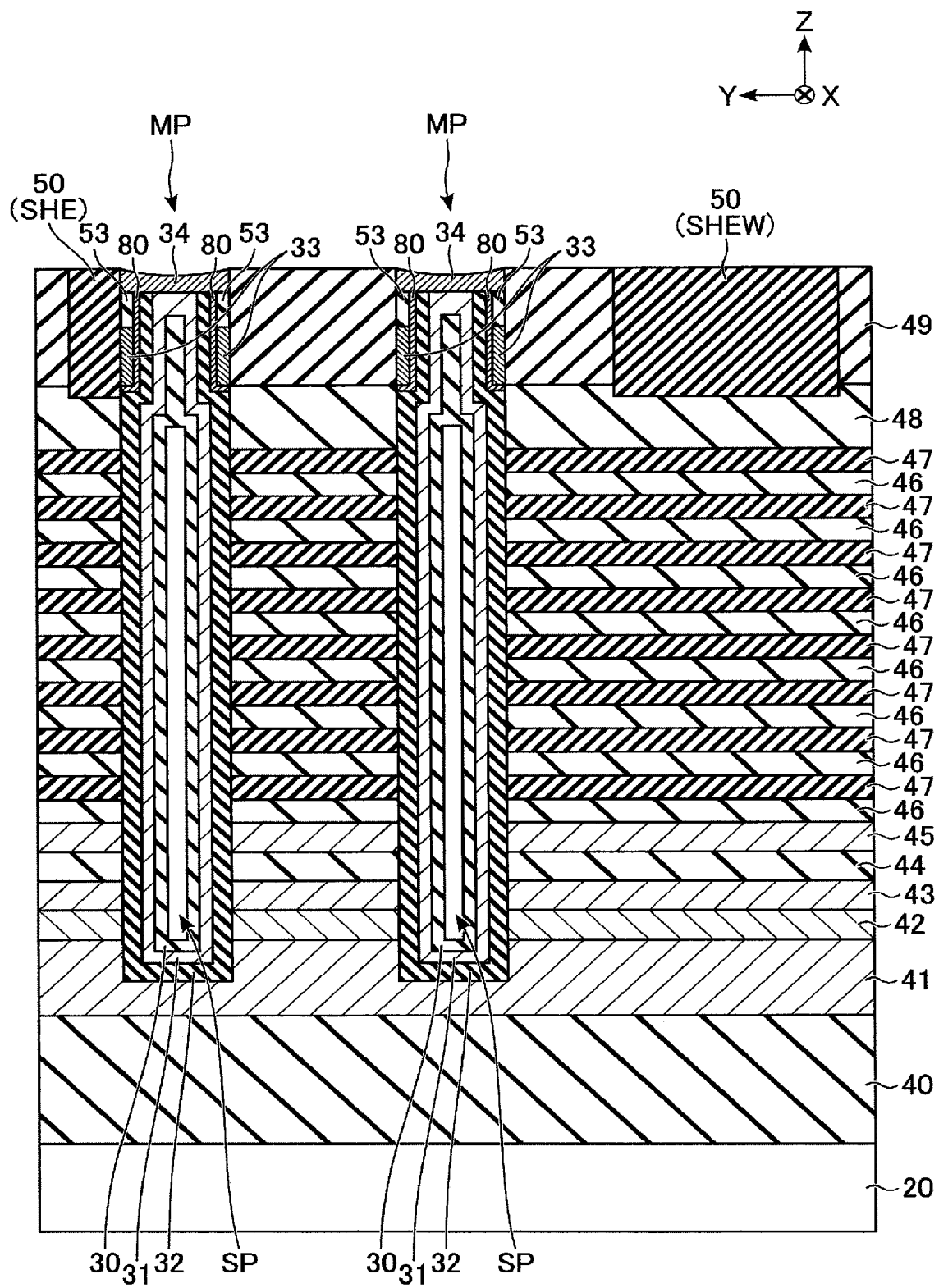
F I G. 39

SEMICONDUCTOR MEMORY DEVICE AND MANUFACTURING METHOD OF SEMICONDUCTOR MEMORY DEVICE

CROSS-REFERENCE TO RELATED APPLICATIONS

This application is based upon and claims the benefit of priority from Japanese Patent Application No. 2018-166072, filed Sep. 5, 2018, the entire contents of which are incorporated herein by reference.

FIELD

Embodiments described herein relate to a semiconductor memory device and a manufacturing method of the semiconductor memory device.

BACKGROUND

A NAND-type flash memory capable of storing data in a non-volatile manner is known.

BRIEF DESCRIPTION OF THE DRAWINGS

FIG. 2 is a circuit diagram showing an example of a circuit configuration of a memory cell array included in the semiconductor memory device according to the first embodiment.

FIG. 3 is a plan view showing an example of a planar layout of the memory cell array included in the semiconductor memory device according to the first embodiment.

FIGS. 11, 12, 13, 14, 15, 16, 17, 18, 19, 20, 21, and 22 are a cross-sectional view of the memory cell array showing an example of a step of manufacturing the semiconductor memory device according to the first embodiment.

FIGS. 24, 25, and 26 is a cross-sectional view of a memory cell array showing an example of a step of manufacturing the semiconductor memory device according to the second embodiment.

FIGS. 29, 30, 31, and 32 are a cross-sectional view of the memory cell array showing an example of a step of manufacturing the semiconductor memory device according to the third embodiment.

FIGS. 35, 36, 37, 38, and 39 are across-sectional view of the memory cell array showing an example of a step of manufacturing the semiconductor memory device according to the fourth embodiment.

DETAILED DESCRIPTION

A semiconductor device according to an embodiment includes a plurality of first conductive layers, a second conductive layer, a first semiconductor layer, a multi-layered body, and a third conductive layer. The plurality of first conductive layers are provided one above the other in a first direction. Each of the first conductive layers is extending in a second direction intersecting the first direction. The second conductive layer is provided above an uppermost layer of the first conductive layers. The first semiconductor layer is extending in the first direction. The multi-layered body includes a charge storage layer. The multi-layered body is provided between the first semiconductor layer and the first conductive layers, and between the first semiconductor layer and the second conductive layer. The third conductive layer is provided between the multi-layered body and the second conductive layer in the second direction. The third conductive layer is electrically coupled to the second conductive layer. The first semiconductor layer includes a first portion facing the uppermost layer of the first conductive layers and a second portion facing the second conductive layer. The first semiconductor layer is continuous at least from the first portion to the second portion.

Hereinafter, the embodiments will be described with reference to the accompanying drawings. Each embodiment is an example of an apparatus or a method to embody a technical idea of the invention. It should be noted that the drawings are schematic or conceptual, and that the dimensions and scales of the drawings are not necessarily the same as those of the actual products. The technical idea of the present invention is not specified by the material, shape, structure, arrangement, etc. of structural elements.

In the explanation below, structural elements having the same functions and configurations will be denoted by the same reference symbols. The numbers after the letters constituting the reference symbols are used to distinguish elements which are denoted by the reference symbols including the same letters and which have similar configurations. If there is no need of mutually distinguishing the elements which are denoted by the reference symbols that include the same letters, the same elements are denoted by the reference symbols that include only the letters.

[1] First Embodiment

A semiconductor memory device 1 according to a first embodiment will be described.

[1-1] Configuration of Semiconductor Memory Device 1

[1-1-1] Overall Configuration of Semiconductor Memory Device 1

The semiconductor memory device 1 is a NAND-type flash memory capable of storing data in a non-volatile manner, for example. The semiconductor memory device 1 is controlled by an external memory controller 2, for example.

Figure 1:
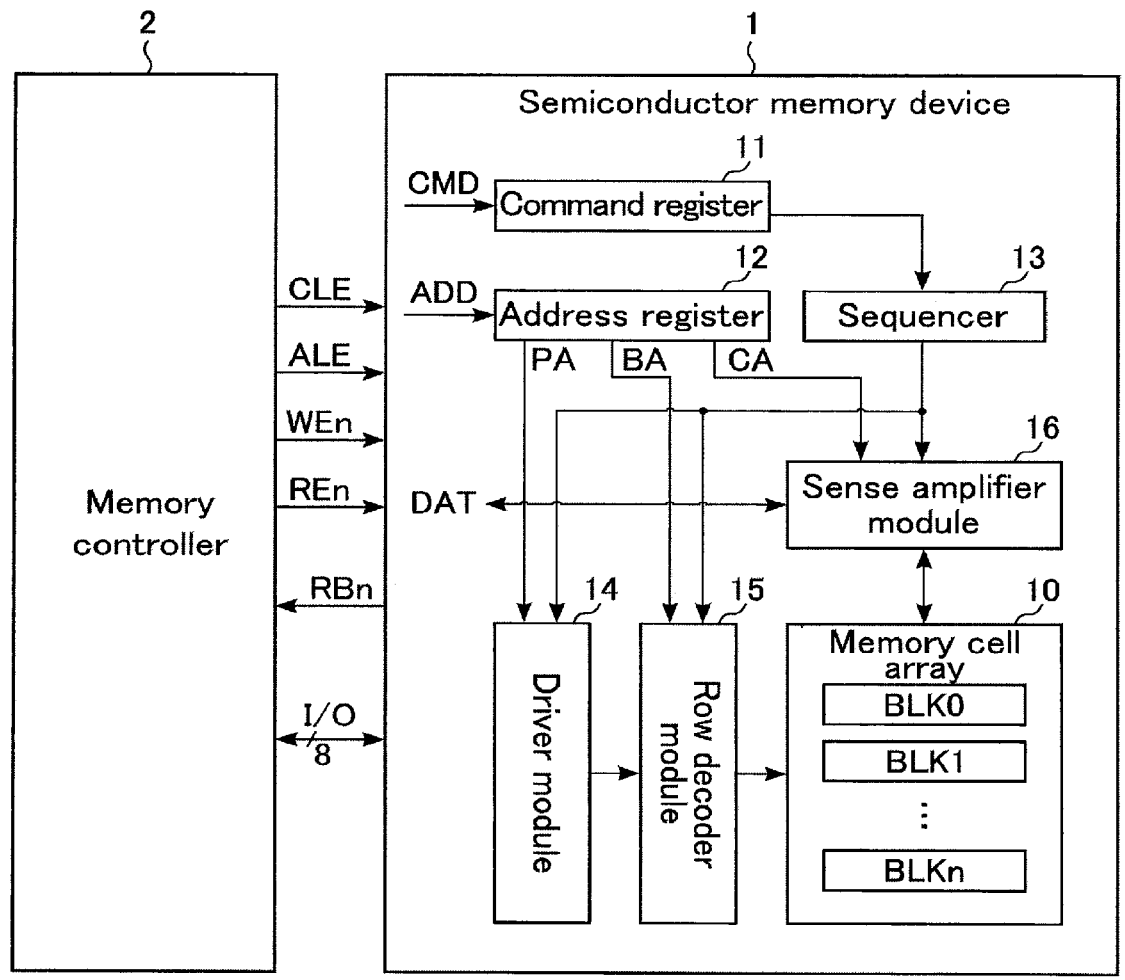
FIG. 1 is a block diagram showing a configuration example of a semiconductor memory device according to a first embodiment.

FIG. 1 shows a configuration example of the semiconductor memory device 1 according to the first embodiment. As shown in FIG. 1, the semiconductor memory device 1 includes a memory cell array 10, a command register 11, an address register 12, a sequencer 13, a driver module 14, a row decoder module 15, and a sense amplifier module 16, for example.

The memory cell array 10 includes a plurality of blocks BLK0 to BLKn (n is an integer equal to or greater than 1). A block BLK is a group of a plurality of memory cells capable of storing data in a non-volatile manner, and is used as, for example, a data erasure unit.

In the memory cell array 10, a plurality of bit lines and a plurality of word lines are provided. Each memory cell is associated with one bit line and one word line, for example. A detailed configuration of the memory cell array 10 will be described later.

The command register 11 retains a command CMD that is received by the semiconductor memory device 1 from the memory controller 2. The command CMD includes commands to cause the sequencer 13 to execute a read operation, a write operation, and an erase operation, for example.

The address register 12 retains address information ADD received by the semiconductor memory device 1 from the memory controller 2. The address information ADD includes a block address BA, a page address PA, and a column address CA, for example. For example, the block address BA, the page address PA, and the column address CA are respectively used for selecting a block BLK, a word line, and a bit line.

The sequencer 13 controls the operation of the entire semiconductor memory device 1. For example, the sequencer 13 performs a read operation, a write operation, and an erase operation by controlling the driver module 14, the row decoder module 15, and the sense amplifier module 16, etc. based on a command CMD retained in the command register 11.

The driver module 14 generates a voltage to be used in a read operation, a write operation, and an erase operation, etc. The driver module 14 applies the generated voltage to a signal line corresponding to the selected word line based on a page address PAd retained in the address register 12, for example.

The row decoder module 15 selects one block BLK in a corresponding memory cell array 10 based on the block address BA retained in the address register 12. The row decoder module 15 transfers the voltage applied to the signal line corresponding to the selected word line to the selected word line in the selected block BLK, for example.

The sense amplifier module 16, in a write operation, applies a desired voltage to each bit line in accordance with write data DAT received from the memory controller 2. The sense amplifier module 16, in a read operation, determines data stored in a memory cell based on the voltage of the bit line, and transfers the determination result as read data DAT to the memory controller 2.

Communication between the semiconductor memory device 1 and the memory controller 2 supports a NAND interface standard, for example. For example, in communication between the semiconductor memory device 1 and the memory controller 2, a command latch enable signal CLE, an address latch enable signal ALE, a write enable signal WEn, and a read enable signal REn, a ready/busy signal RBn, and output signals I/O are used.

The command latch enable signal CLE is a signal for indicating that the input and output signals I/O received by the semiconductor memory device 1 are commands CMD. The address latch enable signal ALE is a signal indicating that the signals I/O received by the semiconductor memory device 1 are address information ADD. The write enable signal WEn is a signal instructing the semiconductor memory device 1 to input the input and output signals I/O. The read enable signal REn is a signal instructing the semiconductor memory device 1 to output the input and output signals I/O.

The ready/busy signal RBn is a signal notifying the memory controller 2 of whether the semiconductor memory device 1 is in a ready state to receive an instruction from the memory controller 2 or is in a busy state to not receive an instruction from the memory controller 2. An input and output signal I/O is a signal having a width of, for example, 8 bits, and may include a command CMD, address information ADD, data DAT, etc.

The semiconductor memory device 1 and the memory controller 2 as described above may be combined to constitute one semiconductor device. Such a semiconductor device may be a memory card, such as an SD™ card, and an SSD (solid state drive).

[1-1-2] Circuit Configuration of Memory Cell Array 10

FIG. 2 shows an example of a circuit configuration of the memory cell array 10 included in the semiconductor memory device 1 according to the first embodiment, and focuses on one block BLK of the plurality of blocks BLK included in the memory cell array 10. As shown in FIG. 2, the block BLK includes four string units SU0 to SU3, for example. Each string unit SU includes a plurality of NAND strings NS.

The plurality of NAND strings NS are respectively associated with bit lines BL0 to BLm (m is an integer equal to or greater than 1). Each NAND string NS includes memory cell transistors MT0 to MT7 and select transistors ST1 and ST2, for example.

Each memory cell transistor MT includes a control gate and a charge accumulation layer, and retains data in a non-volatile manner. Each of the select transistors ST1 and ST2 is used to select the string unit SU in various operations.

In each NAND string NS, the memory cell transistors MT0 to MT7 are coupled in series between the select transistors ST1 and ST2. The control gates of the memory cell transistors MT0 to MT7 in the same block BLK are respectively coupled to word lines WL0 to WL7 in common.

In each NAND string NS, a drain of a select transistor ST1 is coupled to an associated bit line BL, and a source of the select transistor ST1 is coupled to one end of the memory cell transistors MT0 to MT7 that are coupled in series. The gates of the select transistor ST1 in the string units SU0 to SU3 in the same block BLK are respectively coupled in common to the select gate lines SGD0 to SGD3.

In each NAND string NS, a drain of a select transistor ST2 is coupled to the other end of the memory cell transistors MT0 to MT7 that are coupled in series. Sources of the select transistors ST2 are coupled in common to the source line SL, and the gates of the select transistors ST2 are coupled in common to a select gate line SGS, in the same block BLK.

In the circuit configuration of the memory cell array 10 described above, the bit line BL is coupled in common to a plurality of corresponding NAND strings NS in each block BLK, for example. The source line SL is coupled in common to a plurality of blocks BLK, for example.

A group of the plurality of memory cell transistors MT coupled to a common word line WL in one string unit SU is called, for example, a cell unit CU. For example, a storage capacity of the cell unit CU including memory cell transistors MT each storing 1-bit data is defined as "one-page data." The storage capacity of the cell unit CU may be two-page data or more in accordance with the number of bits of data stored in the memory cell transistors MT.

The circuit configuration of the memory cell array 10 included in the semiconductor memory device 1 according to the first embodiment is not limited to the configuration described above. For example, each of the numbers of the memory cell transistors MT and the select transistors ST1 and ST2 that are included in each NAND string NS may be determined as a given number. The number of string units SU included in each block BLK may be determined as a given number.

[1-1-3] Structure of Memory Cell Array 10

An example of a structure of the memory cell array 10 according to the first embodiment will be explained below.

In the drawings referred to below, the X-axis direction corresponds to the extending direction of word lines WL. The Y-axis direction corresponds to the extending direction of the bit lines BL. The Z-axis direction corresponds to a vertical direction relative to the surface of the semiconductor substrate 20 on which the semiconductor memory device 1 is formed.

In the cross-sectional view referred to below, structural elements such as an insulation layer (an interlayer insulation film), a wire, and a contact are suitably omitted for better viewability. In the plan view, hatching is suitably added for better viewability. The hatching added to the plan view is not necessarily related to materials or characteristics of the hatched structural elements.

FIG. 3 is an example of a planar layout of the memory cell array 10 included in the semiconductor memory device 1 according to the first embodiment, and focuses on structures respectively corresponding to the string units SU0 and SU1. As shown in FIG. 3, the area where the memory cell array 10 is formed includes a plurality of slits SLT, SHE, and SHEW, and a plurality of bit lines BL, for example.

The slit SLT divides each of conductors corresponding to the word lines WL and a conductor corresponding to the select gate line SGS that are described later. Each of the slits SHE and SHEW divides the conductor corresponding to the select gate line SGD described later. Each of the slits SLT, SHE, and SHEW includes an insulator.

The plurality of slits SLT respectively extend in the X-axis direction, and are arranged in the Y-axis direction. Between slits SLT adjacent to each other in the Y-axis direction, a slit SHE extending in the X-axis direction is arranged. Each of the plurality of slits SLT overlaps with a slit SHEW extending in the X-axis direction, for example.

The slit SHEW is wider than the slit SHE. The slit SHEW is also wider than the slit SLT. In the plan view, a portion of a slit SLT overlapping with a slit SHEW is included in the area of the slit SHEW.

In this example, one string unit SU corresponds to a structure between slits SLT and SHE adjacent to each other in the Y-axis direction.

Specifically, for example, the string units SU0 and SU1 respectively extend in the X-axis direction, and are arranged in the Y-axis direction. The string units SU0 and SU1 are arranged between two slits SLT adjacent to each other in the Y-axis direction. In other words, the string units SU0 and SU1 are arranged between two slits SHEW adjacent to each other in the Y-axis direction. The slit SHE is arranged between the string units SU0 and SU1.

Each string unit SU includes a plurality of memory pillars MP. Each of the memory pillars MP functions as one NAND string NS, for example. The plurality of memory pillars MP are arranged in a staggered manner along the X-axis direction, for example.

In each of the string units SU0 and SU1, a memory pillar MP arranged in the vicinity of the slit SHE has, for example, a portion overlapping with the slit SHE. The memory pillar MP may be arranged to overlap with the slit SHEW, and only has to avoid overlapping with a slit SLT.

The plurality of bit lines BL respectively extend in the Y-axis direction, and are arranged in the X-axis direction. For example, each bit line BL is arranged so as to overlap with at least one memory pillar MP in each string unit SU. For example, two bit lines BL overlap with each memory pillar MP.

A contact CP is provided between one bit line BL among a plurality of bit lines BL overlapping with a memory pillar MP and the memory pillar MP. Each memory pillar MP is electrically coupled to a corresponding bit line BL via a contact CP.

The number of string units SU provided between neighboring slits SLT may be determined as a given number. The number and arrangement of the memory pillars MP shown in FIG. 3 are merely an example, and may be determined discretionarily. The number of bit lines BL overlapping with each memory pillar MP may be determined as a given number.

Figure 4:
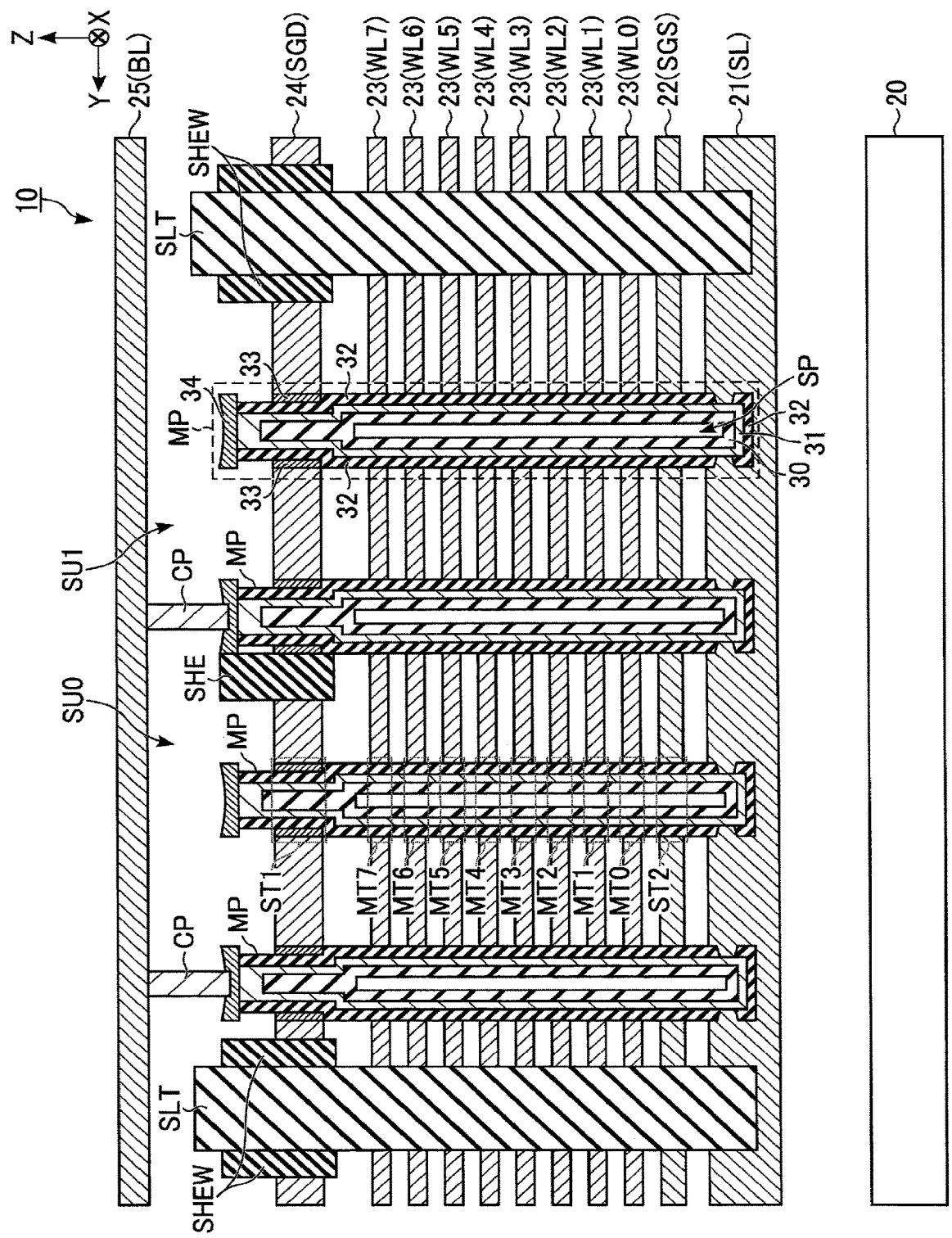
FIG. 4 is a cross-sectional view showing an example of a cross-sectional structure of the memory cell array included in the semiconductor memory device according to the first embodiment.

FIG. 4 is a cross-sectional view taken along line IV-IV of FIG. 3, and shows an example of a cross-sectional structure of the memory cell array 10 included in the semiconductor memory device 1 according to the first embodiment. As shown in FIG. 4, the area where the memory cell array 10 is formed includes, for example, conductive layers 21 to 25, the memory pillars MP, the contacts CP, and the slits SLT, SHE, and SHEW.

Specifically, the conductive layer 21 is provided above the semiconductor substrate 20 with an insulation layer being interposed therebetween. In the insulation layer between the semiconductor substrate 20 and the conductive layer 21, for example, a circuit such as a sense amplifier module 16 is provided (not shown). The conductive layer 21 is formed in a plate-like shape extending along the X-Y plane, and functions as a source line SL, for example. The conductive layer 21 includes silicon (Si), for example.

A conductive layer 22 is provided above the conductive layer 21 with an insulation layer being interposed therebetween. The conductive layer 22 is formed in a plate-like shape extending along the X-Y plane, and is used as a select gate line SGS, for example. The conductive layer 22 includes silicon (Si), for example.

The insulation layers and the conductive layers 23 are alternately stacked above the conductive layer 22. A conductive layers 23 is formed in a plate-like shape extending along the X-Y plane, for example. The stacked conductive layers 23 respectively function as word lines WL0 to WL7, from the side of the semiconductor substrate 20. The conductive layers 23 include tungsten (W), for example.

The conductive layer 24 is provided above the uppermost conductive layer 23 with an insulation layer being interposed therebetween. The conductive layer 24 is formed in a plate-like shape extending along the X-Y plane, and is used as a select gate line SGD, for example. The conductive layer 24 includes tungsten (W), for example. A thickness of the insulation layer between the conductive layer 24 and the uppermost conductive layer 23 is thicker than the insulation layer between two conductive layers 23 adjacent to each other.

A conductive layer 25 is provided above the conductive layer 24 with an insulation layer being interposed therebetween. For example, the conductive layer 25 is formed in a linear shape extending along the Y-axis direction, and is used as the bit line BL. Accordingly, a plurality of conductive layers 25 are arranged along the X-axis direction in an area not shown. A conductive layer 25 includes copper (Cu), for example.

The memory pillar MP (the area surrounded by a dotted line) extends along the Z-axis direction, and, for example, penetrates the conductive layers 22-24. The top end of the memory pillar MP is included in the layer between the layers where the conductive layers 24 and 25 are provided, for example. The bottom end of the memory pillar MP is included in the conductive layer 21, for example.

The memory pillar MP includes a core member 30, a semiconductor layer 31, a multi-layered film 32, and semiconductor layers 33 and 34, for example.

The core member 30 extends in the Z-axis direction. The top end of the core member 30 is included in, for example, a layer higher than the layer where the conductive layer 24 is provided. The core member 30 includes an insulator such as oxide silicon ($SiO_2$).

A space SP is formed inside the core member 30. The space SP extends in the Z-axis direction. The top end of the space SP is included in the layer between the layers where the uppermost conductive layer 23 and the conductive layer 24 are provided, for example. The bottom end of the space SP is included in a layer lower than the layer where the conductive layer 22 is provided, for example.

In other words, the space SP crosses the plurality of layers where the conductive layers 22 and 23 are provided. Accordingly, the core member 30 is formed in a cylindrical shape at the position crossing the plurality of layers where the conductive layer 22 and the conductive layers 23 are provided.

Accordingly, the outer diameter of the core member 30 in the layer where the conductive layer 24 is provided is smaller than the outer diameter of the core member 30 in the layer where the conductive layer 22 or 23 is provided. In the present description, the term "outer diameter" indicates an outer diameter of a cross-section area parallel to, for example, the semiconductor substrate 20, and the term "inner diameter" indicates an inner diameter of a cross-section area parallel to, for example, the semiconductor substrate 20.

The core member 30 is covered with a semiconductor layer 31. The semiconductor layer 31 is directly in contact with the conductive layer 21 via, for example, the side surface of the memory pillar MP at the position where the semiconductor layer 31 is not covered with the multi-layered film 32 at the bottom portion of the memory pillar (MP). The outer diameter of the semiconductor layer 31 in the layer where the conductive layer 24 is provided is smaller than the outer diameter of the semiconductor layer 31 in the layer where the conductive layer 22 or 23 is provided.

In the semiconductor layer 31, the portions crossing the conductive layers 23 and the portion crossing the conductive layer 24 are provided continuously. In the present description, the phrase "provided continuously" indicates being formed in the same manufacturing step. Portions provided continuously in a structural element do not have a border therebetween. Furthermore, the phrase "provided continuously" means being a continuous film from a first portion to a second portion in a film or a layer.

The thickness of the semiconductor layer 31 in the layer where the conductive layer 24 is provided is approximately equal to, for example, the thickness of the semiconductor layer 31 in the layer where the conductive layer 22 or 23 is provided. The semiconductor layer 31 is polysilicon (Si), for example. In the present description, the term "thickness" indicates the difference between the inner diameter and the outer diameter of the structural element, for example.

The side surface and the bottom surface of the semiconductor layer 31, except for the position directly in contact with the conductive layer 21 and the semiconductor layer 31, are covered with the multi-layered film 32. The outer diameter of the multi-layered film 32 in the layer where the conductive layer 24 is provided is smaller than the outer diameter of the multi-layered film 32 in the layer where the conductive layer 22 or 23 is provided.

The thickness of the multi-layered film 32 in the layer where the conductive layer 24 is provided is approximately equal to, for example, the thickness of the multi-layered film 32 in the layer where the conductive layer 22 or 23 is provided. In the multi-layered film 32, the portions crossing the conductive layers 23 and the portion crossing the conductive layer 24 are provided continuously.

The side surface of the multi-layered film 32 has a portion covered with the semiconductor layer 33 in the layer where the conductive layer 24 is formed. The semiconductor layer 33 is formed in a cylindrical shape, for example. The layer where the semiconductor layer 33 overlaps with the layer where the conductive layer 24 is provided.

At least a part of the semiconductor layer 33 is in contact with the conductive layer 24, and the semiconductor layer 33 is electrically coupled to the conductive layer 24 via the contact portion. Of course, a larger area of the portion where the semiconductor layer 33 is in contact with the conductive layer 24 provides better electrical connection, and thus is preferable.

The memory pillar MP includes a portion between the outer diameter of the semiconductor layer 33 and the outer diameter of the multi-layered film 32 continuously changes. In other words, the side surface of the semiconductor layer 33 is aligned with the side surface of the multi-layered film 32 in contact with the bottom surface of the semiconductor layer 33. In the present description, the phrase "the outer diameters continuously change" indicates that, in the same contact hole, if first and second structural elements each in contact with the inner wall of the contact hole are provided, the border portion between the first and second structural elements is in contact with the inner wall of the contact hole.

The semiconductor layer 33 is silicon (Si) doped with boron (B), for example. An impurity doped into the semiconductor layer 33 is not limited to boron (B), and other impurities such as phosphorus (P) and arsenic (As) may be used.

The density of the impurity doped into the semiconductor layer 33 is $10^{19}$ atoms/cm$^3$ or higher, for example. A preferable density of the impurity doped into the semiconductor layer 33 is about $10^{19}$ atoms/cm$^3$, for example. A contact resistance between the semiconductor layer 33 and the conductive layer 24 may decrease as the density of the impurity doped into the semiconductor layer 33 increases.

A semiconductor layer 34 is provided on the top surfaces of the semiconductor layer 31 and the multi-layered film 32. The semiconductor layer 34 is used as a cap member that protects the structure formed in the memory pillar MP, for example. The semiconductor layer 34 may be made of the same material as the semiconductor layer 31. The semiconductor layer 34 is, for example, polysilicon (Si).

Figure 5:
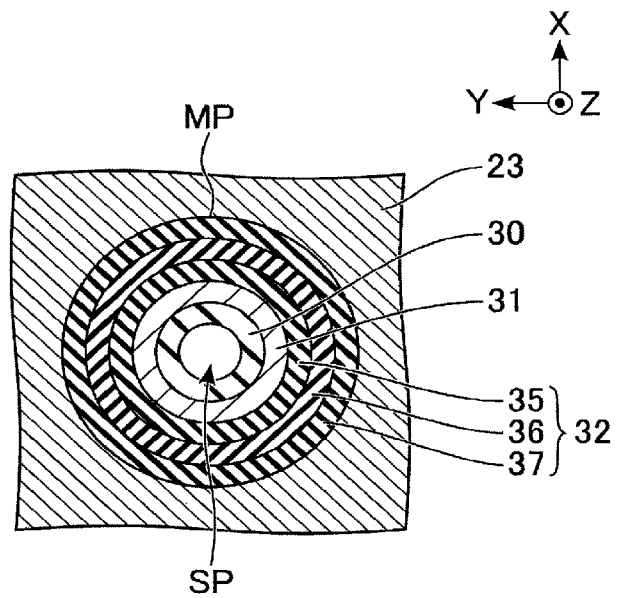
FIGS. 5 and 6 are a cross-sectional view showing an example of a cross-sectional structure of a memory pillar in the semiconductor memory device according to the first embodiment.

FIG. 5 shows an example of a cross-sectional structure of the memory pillar MP in a cross-section, which is parallel to the surface of the semiconductor substrate 20 and includes a conductive layer 23. As shown in FIG. 5, in a layer including the conductive layer 23, the space SP is formed at the center of the memory pillar MP. The core member 30 surrounds the space SP. The semiconductor layer 31 surrounds the side surface of the core member 30. The multi-layered film 32 surrounds the side surface of the semiconductor layer 31. The multi-layered film 32 includes a tunnel oxide film 35, an insulation film 36, and a block insulation film 37, for example.

The tunnel oxide film 35 surrounds the side surface of the semiconductor layer 31. The insulation film 36 surrounds the side surface of the tunnel oxide film 35. The block insulation film 37 surrounds the side surface of the insulation film 36. The conductive layer 23 surrounds the side surface of the block insulation film 37.

The tunnel oxide film 35 includes silicon oxide (SiO$_2$), for example. The insulating film 36 includes silicon nitride (SiN), for example. The block insulation film 37 includes silicon oxide (SiO$_2$), for example.

Figure 6:
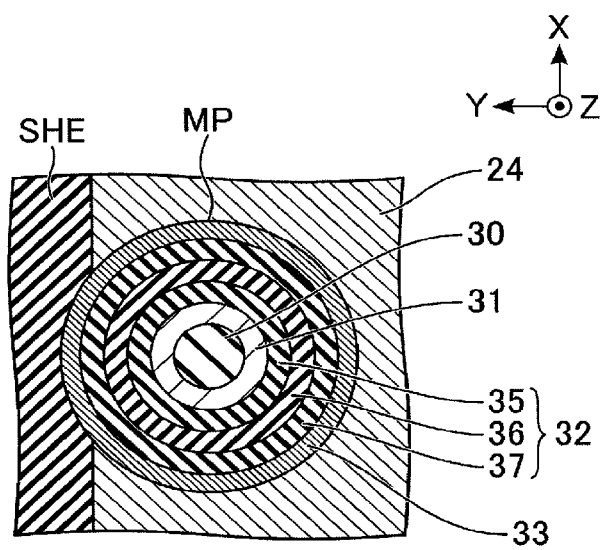

FIG. 6 shows an example of a cross-sectional structure of the memory pillar MP in contact with the slit SHE in a layer including the conductive layer 24. As shown in FIG. 6, in the layer including the conductive layer 24, the core member 30 is provided at the center of the memory pillar MP. The semiconductor layer 31 surrounds the side surface of the core member 30. The multi-layered film 32 surrounds the side surface of the semiconductor layer 31. The semiconductor layer 33 surrounds the side surface of the multi-layered film 32. The side surface of the semiconductor layer 33 is surrounded by the conductive layer 24 and the slit SHE.

FIG. 6 shows an example where a part of the side surface of the semiconductor layer 33 is in contact with the slit SHE; however, the semiconductor layer 33 is not necessarily in contact with the slit SHE. In each memory pillar MP, it is only required that at least the semiconductor layer 33 covers the multi-layered film 32, and at least the semiconductor layer 33 and the conductive layer 24 are electrically coupled to each other.

Referring back to FIG. 4, the columnar contact CP is provided on the semiconductor layer 34. In the area shown in FIG. 4, contacts CP corresponding to two memory pillars MP among the four memory pillars MP. In the area not shown in FIG. 4, a contact CP is coupled to each of the memory pillars MP not coupled to a contact CP in the shown area.

The top surface of a contact CP is in contact with one conductive layer 25, in other words, one bit line BL. A memory pillar MP may be coupled electrically to the conductive layer 25 via two or more contacts, or via other wires.

Each of the slits SHE and SHEW is formed into a plate-like shape extending along the Z-axis direction, and divides the conductive layer 24, for example. The top end of each of the slits SHE and SHEW is included in, for example, the layer between the layer in which the conductive layer 24 is provided and the layer in which the conductive layer 25 is provided. The bottom end of each of the slits SHE and SHEW is included in the layer between the layer in which the conductive layer 24 is provided and the layer in which the uppermost conductive layer 23 is provided, for example.

An insulator is provided in each of the slits SHE and SHEW. The insulator includes an insulator such as silicon oxide (SiO$_2$), for example.

The slit SLT is formed into a plate-like shape extending along the Z-axis direction, and divides the conductive layers 22 and 23 and the slit SHEW, for example. The top end of the slit SLT is included in, for example, the layer including the top end of the slit SHE and the layer in which the conductive layer 25 is provided. The bottom end of the slit SLT is included in the layer where the conductive layer 21 is provided, for example.

An insulator is provided in the slit SLT. The insulator includes an insulator such as silicon oxide (SiO$_2$), for example. The slit SLT may include multiple types of insulators. For example, before the slit SLT is filled with silicon oxide, silicon nitride (SiN) may be formed as a side wall of the slit SLT.

In the configuration of the memory pillar MP explained above, the portion where the memory pillar MP crosses the conductive layer 22 functions as a select transistor ST2. Each of the portions where the memory pillar MP crosses the conductive layers 23 functions as a memory cell transistor MT. The portion where the memory pillar MP crosses the conductive layer 24 functions as a select transistor ST1.

In other words, the semiconductor layer 31 is used as a channel for each of the memory cell transistors MT and the select transistors ST1 and ST2. The semiconductor layer 33 is used as a gate electrode of a select transistor ST1. The insulation film 36 is used as a charge accumulation layer of the memory cell transistor MT.

The configuration of the memory cell array 10 described above is merely an example, and the memory cell array 10 may have other configurations. For example, the number of the conductive layers 23 is determined based on the number of the word lines WL. A plurality of conductive layers 22 provided in a plurality of layers may be allocated as select gate lines SGS. If the select gate lines SGS are provided in a plurality of layers, a conductor different from the conductive layer 22 may be used.

[1-2] Manufacturing Method of Semiconductor Memory Device 1

Figure 7:
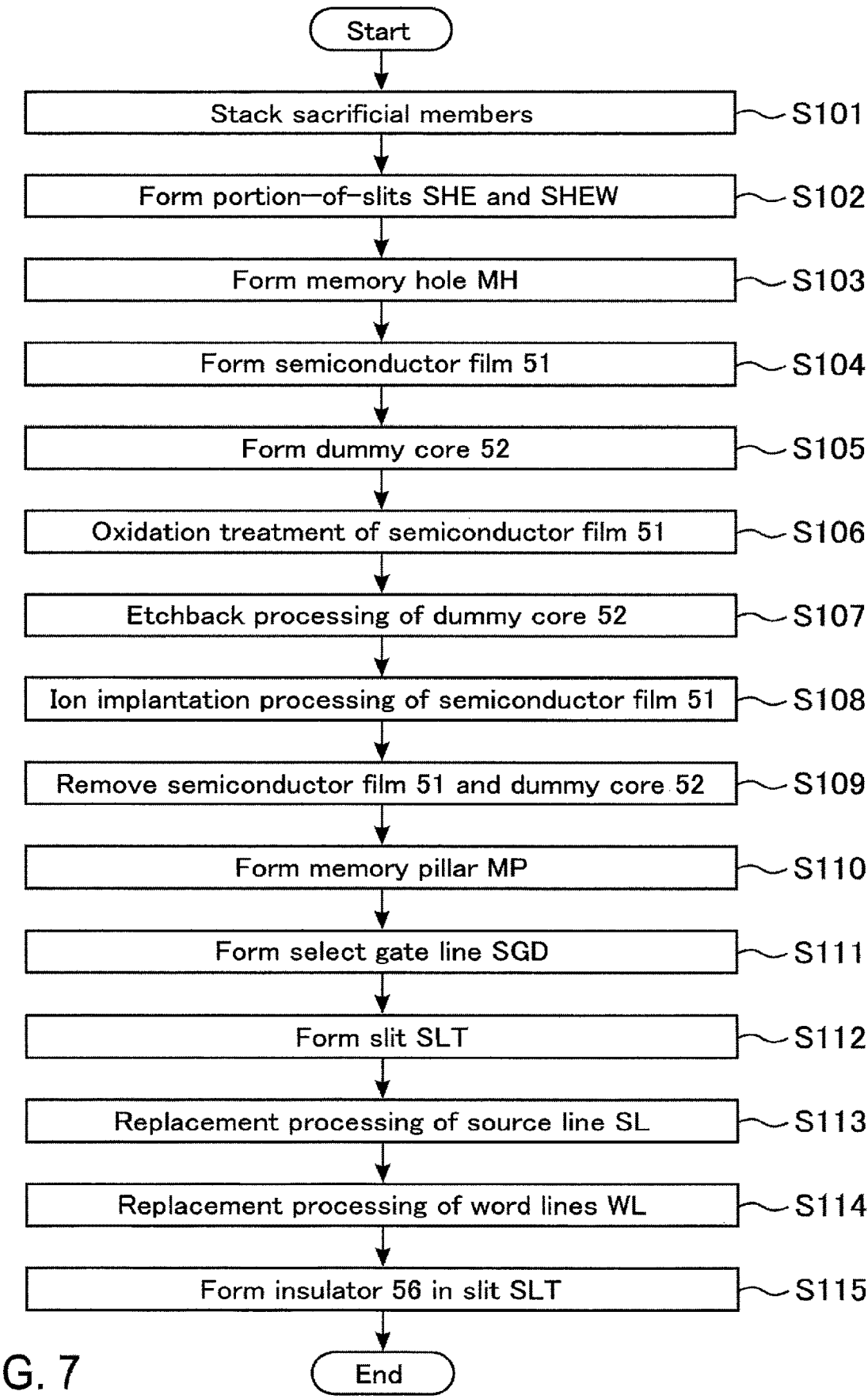
FIG. 7 is a flowchart showing an example of a manufacturing method of the semiconductor memory device according to the first embodiment.

FIG. 7 is a flowchart showing an example of a manufacturing method of the semiconductor memory device 1 according to the first embodiment. Each of FIG. 8 to FIG. 26 shows an example of a cross-sectional structure or a planar layout including the structure corresponding to the memory cell array 10 in a manufacturing process of the semiconductor memory device 1 of the first embodiment.

With reference to FIG. 7, the following description exemplifies the series of manufacturing steps from formation of a stacked structure corresponding to the source line SL to formation of the slit SLT in the semiconductor memory device 1 according to the first embodiment. In the description below, the term "wafer" indicates a structure formed on the semiconductor substrate 20 in the manufacturing process of the semiconductor memory device 1.

Figure 8:
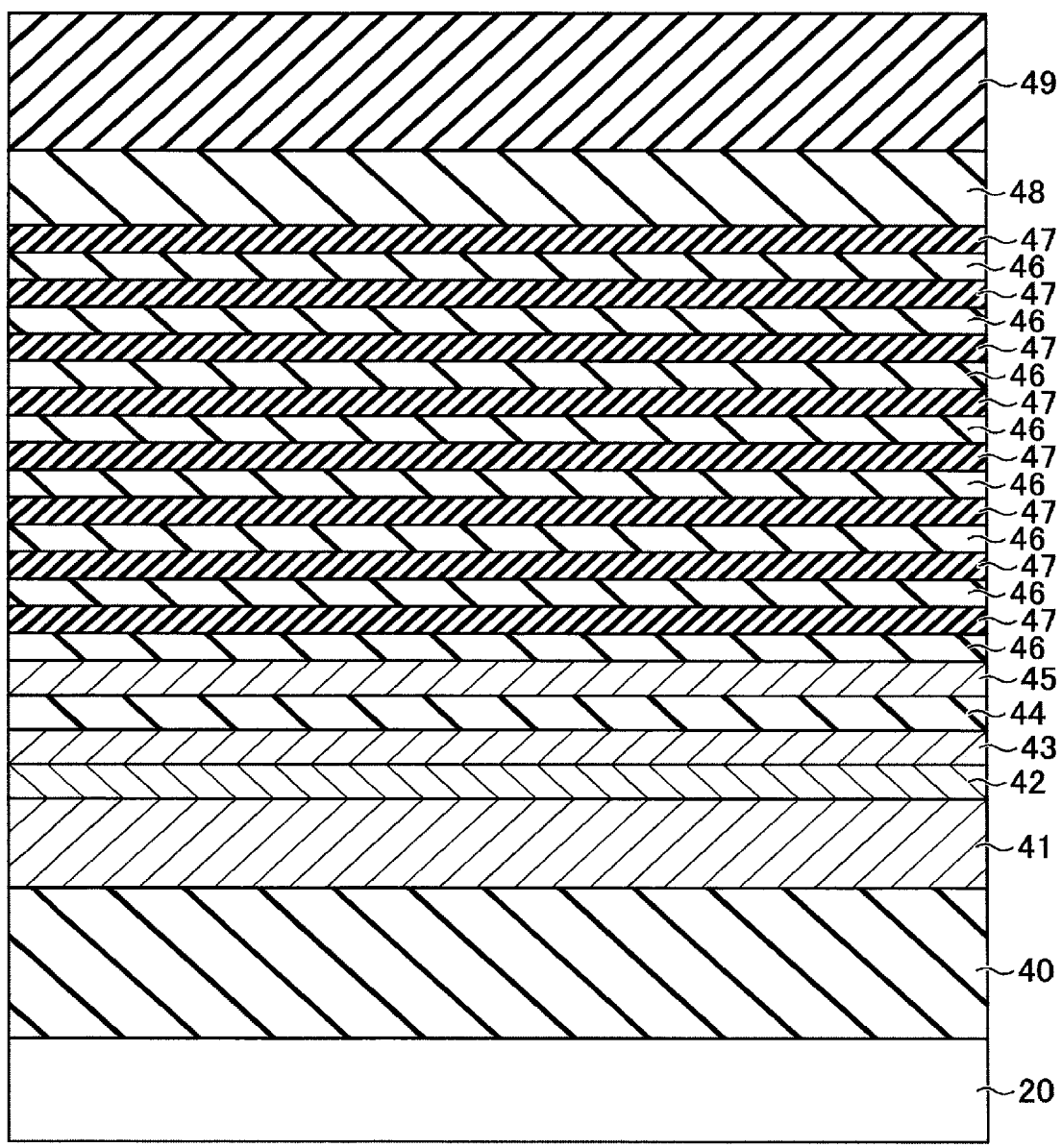
FIGS. 8 and 9 are a cross-sectional view of the memory cell array showing an example of a step of manufacturing the semiconductor memory device according to the first embodiment.

First, processing of the step S101 is performed so as to stack a plurality of sacrificial members respectively corresponding to the source line SL, the word lines WL, and the select gate lines SGS and SGD. Specifically, an insulation layer 40, a conductive layer 41, a sacrificial member 42, a conductive layer 43, an insulation layer 44, and a conductive layer 45 are first formed on the semiconductor substrate 20, as shown in FIG. 8. Next, insulation layers 46 and sacrificial members 47 are alternately stacked on the conductive layer 45, and an insulation layer 48 and a sacrificial member 49 are formed in order on the uppermost sacrificial member 47.

The sacrificial member 42 corresponds to the source line SL. Each of the conductive layers 41 and 43 include silicon (Si), for example. A material of the sacrificial member 42 is capable of having a high etching selection ratio with respect to each of the conductive layers 41 and 43. The conductive layer 45 is polysilicon (Si), for example. The conductive layer 45 corresponds to the conductive layer 22 explained with reference to FIG. 4, and is used as the select gate line SGS, for example. Each of the insulation layers 46 and 48 includes silicon oxide (SiO$_2$), for example. Each sacrificial member 47 corresponds to a word line WL, for example. In other words, the number of layers in which the sacrificial members 47 are formed corresponds to the number of word lines WL that are stacked. The sacrificial member 49 corresponds to the select gate line SGD. Each of the sacrificial members 47 and 49 includes silicon nitride (SiN), for example.

Figure 9:
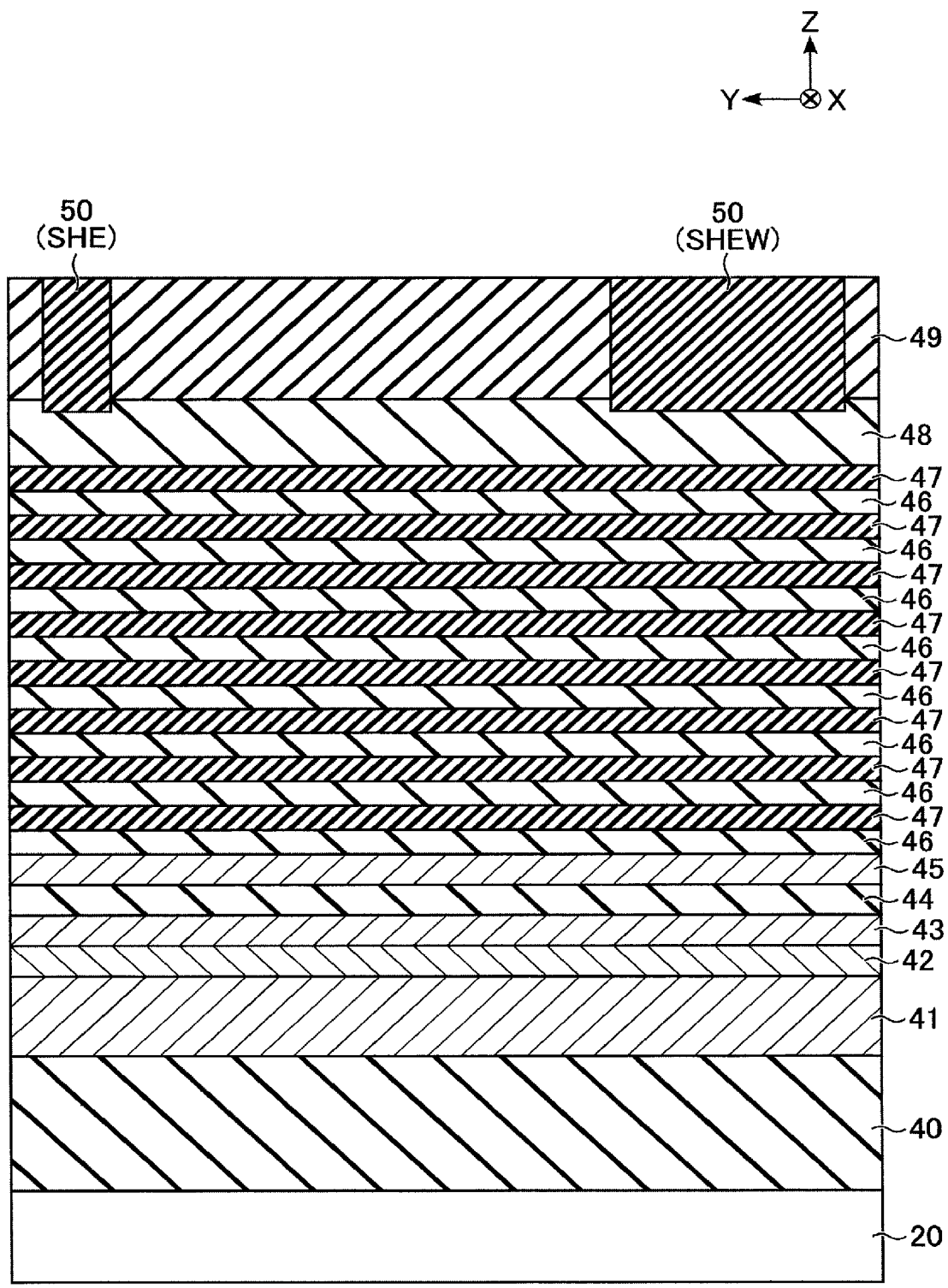

Next, as shown in FIG. 9, processing of step S102 is performed so as to form a portion-of-slits SHE and SHEW. The portion-of-slits SHE and SHEW indicates a set of the slits SHE and SHEW and an insulator formed in the slits SHE and SHEW. Specifically, first, a mask in which areas corresponding to the slits SHE and SHEW are opened is formed by photolithography, etc. Then, the slits SHE and SHEW are formed by anisotropic etching using the formed mask.

Each of the slits SHE and SHEW formed in this step divides the sacrificial member 49. The bottom of each of the slits SHE and SHEW is in the insulation layer 48, for example. The anisotropic etching in this step is RIE (Reactive Ion Etching), for example.

Afterwards, an insulator 50 is formed on the entire top surface of the wafer, and the slits SHE and SHEW are filled with the insulator 50. The insulator 50 formed on the outside of the slits SHE and SHEW is removed by, for example, CMP (Chemical Mechanical Polishing).

As a result, a structure in which each of the slits SHE and SHEW is filled with the insulator 50 is formed. The insulator 50 includes silicon oxide (SiO$_2$), for example.

Next, processing of step S103 is performed so as to form memory holes MH. Specifically, first, a mask in which areas corresponding to the memory pillars MP are opened is formed by, for example, photolithography. Then, the memory holes MH are formed by anisotropic etching using the formed mask.

Figure 10:
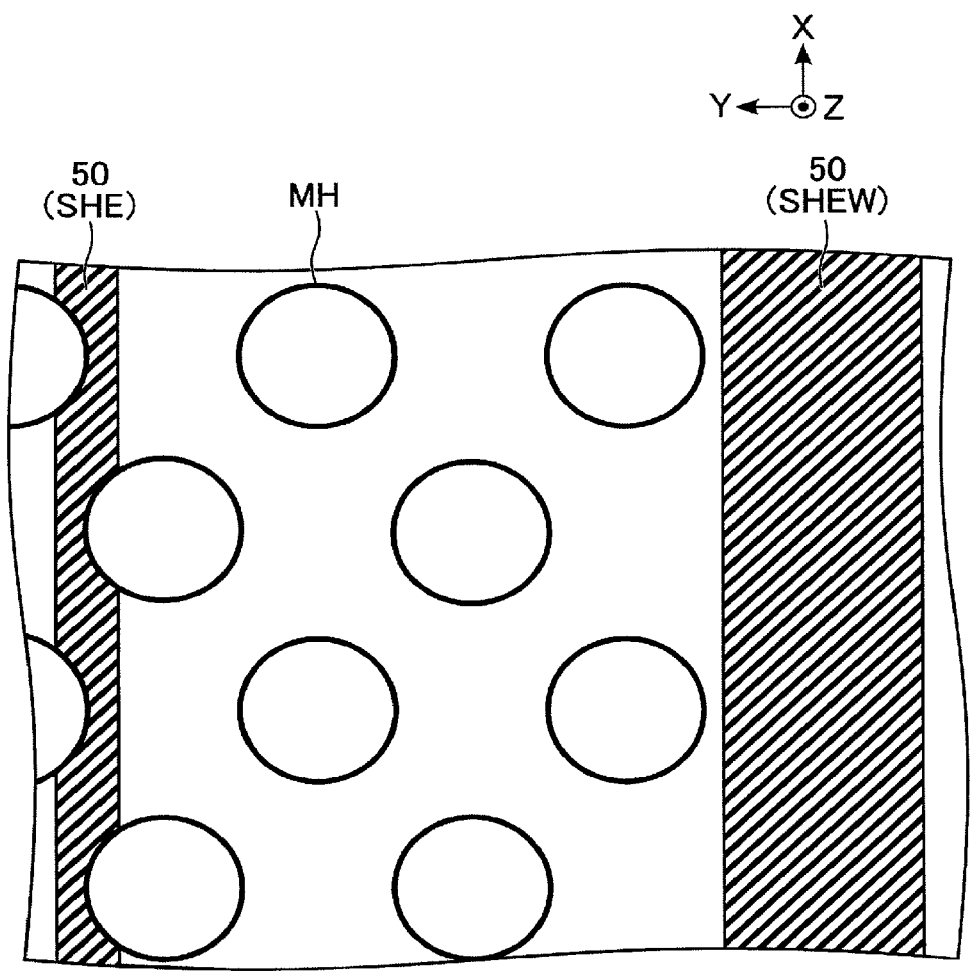
FIG. 10 is a planar layout view of the memory cell array showing an example of a step of manufacturing the semiconductor memory device according to the first embodiment.

As shown in FIG. 10, the memory holes MH are arranged in a staggered manner, for example. Some of the plurality of formed memory holes MH overlap with the slit SHE. The description about the manufacturing method in the first embodiment exemplifies a case where there are memory holes MH overlapping with the slit SHE and there is no memory hole MH overlapping with the slit SHEW. It is acceptable that the memory holes MH overlap with the slit SHEW, as long as the memory holes MH do not overlap with the slit SLT formed in the later manufacturing process.

A memory hole MH formed in this step penetrates each of the sacrificial member 49, the insulation layer 48, the plurality of sacrificial members 47, the plurality of insulation layers 46, the conductive layer 45, the insulation layer 44, the conductive layer 43, and the sacrificial member 42, for example.

The bottom of the memory hole. MH is in the layer where the conductive layer 41 is provided, for example. When a memory hole MH overlapping with the slit SHE is formed, a part of the slit SHE is removed. The anisotropic etching in this step is RIE, for example.

Next, as shown in FIG. 11, a semiconductor film 51, a dummy core 52, and an oxide film 53 are formed. Specifically, first, processing of step S104 is performed so as to form the semiconductor film 51 on the top surface of the wafer and on the inner wall and the bottom surface of a memory hole MH. The semiconductor film 51 is non-doped amorphous silicon, for example. The film thickness of the semiconductor film 51 formed in this step corresponds to, for example, the thickness of the semiconductor layer 33 described with reference to FIG. 4.

Then, processing of step S105 is performed so as to form the dummy core 52 in the memory hole MH. Specifically, first, an insulator corresponding to the dummy core 52 is formed on the wafer, and the memory hole MH is filled with the insulator. Subsequently, etchback processing is performed to the insulator so as to remove the insulator formed on the top surface of the semiconductor film 51, and to process the insulator to have a desired height in the memory hole MH.

In the structure formed as a result, the dummy core 52 is recessed in the memory hole MH. The top surface of the dummy core 52 is included in the layer where the sacrificial member 49 is formed, and is arranged in the vicinity of the top surface of the semiconductor layer 33 described with reference to FIG. 4. The dummy core 52 includes silicon nitride (SiN), for example.

Afterwards, processing of step S106 is performed to perform oxidation treatment to the semiconductor film 51. In this step, the portion of the semiconductor film 51 that is exposed on the wafer is selectively oxidized to form the oxide film 53. In other words, in this step, oxidation of the semiconductor film 51, which is formed on the side surface and the bottom surface of the dummy core 52 in the memory hole MH, is suppressed.

Next, as shown in FIG. 12, the semiconductor layer 33 doped with an impurity is formed on the side surface of the memory hole MH. Specifically, first, processing of step S107 is performed so as to perform etchback processing to the dummy core 52. In this step, for example, the dummy core 52 is processed so that the top surface of the dummy core 52 is included in the layer where the sacrificial member 49 is formed, and the top surface of the dummy core 52 and is arranged in the vicinity of the insulation layer 48.

Subsequently, processing of step S108 is performed so as to implant ions to the semiconductor film 51. In this step, an impurity (e.g., boron) is injected into the semiconductor layer film 51 exposed in the memory hole MH, and then the semiconductor film 51 is subjected to heat treatment. As a result, the portion of the semiconductor film 51 where the impurity is injected is recrystallized to form the semiconductor layer 33 doped with the impurity on the side surface of the memory hole MH.

Next, processing of step S109 is performed so as to remove the semiconductor film 51 and the dummy core 52.

Specifically, first, as shown in FIG. 13, the dummy core 52 (silicon nitride) is removed by, for example, wet etching. Afterwards, the semiconductor film 51 (amorphous silicon) in the memory hole MH is selectively removed by, for example, wet etching.

In the wet etching in this step, an etching solution capable of providing a high selection ratio between the semiconductor film 51 and the semiconductor layer 33 is used. Accordingly, as the impurity doped into the semiconductor layer 33 in step S108, a material capable of having a high selection ratio in this step is selected.

Next, processing of step S110 is performed so as to form a memory pillar MP. Specifically, first, as shown in FIG. 14, for example, the multi-layered film 32 (the block insulation film 37, the insulation film 36, and the tunnel oxide film 35) and the semiconductor layer 31 are formed in this order on each of the top surface of the wafer and the inner wall of the memory hole MH.

At this time, the core member 30 closes in, for example, the layer where the sacrificial member 49, since the semiconductor layer 33 and the oxide film 53 decreases the inner diameter of the upper part of the memory hole MH.

As a result, the space SP described with reference to FIG. 4 is formed inside the core member 30. Subsequently, the core member 30 formed on the top surface of the wafer is removed, and the core member 30 formed in the memory hole MH is recessed. Then, the part where the core member 30 is recessed is filled with the semiconductor layer 31.

As a result, as shown in FIG. 15, the top surface of the core member 30 is located in the layer where the sacrificial member 49 is provided, is located in a higher layer than the upper surface of the semiconductor layer 33, and is covered with the semiconductor layer 31.

Next, as shown in FIG. 16, a structure in which the semiconductor layer 34 is provided in the upper part of the memory hole MH is formed. Specifically, first, the semiconductor layer 31, the multi-layered film 32, and the oxide film 53 formed on the top surface of the wafer are removed, and the upper part of the structure formed in the memory hole MH is recessed. Subsequently, the semiconductor layer 34 is formed on the top surface of the wafer, and then etched back.

As a result, a structure in which the semiconductor layer 34 is provided on the top surfaces of the semiconductor layer 31, the multi-layered film 32, and the oxide film 53 is formed in the memory hole MH. The structure formed in the memory hole MH in this step corresponds to the structure of the memory pillar MP described with reference to FIG. 4.

Next, processing of step S111 is performed so as to form the select gate line SGD. Specifically, first, as shown in FIG. 17, the sacrificial member 49 is removed by, for example, wet etching. In this etching, an etching solution capable of providing a high selection ratio between the insulator 50 and the sacrificial member 49 is used.

Subsequently, the conductive layer 24 is formed on the top surface of the wafer, and the part from which the sacrificial member 49 is removed is filled with the semiconductor layer 24. Then, etchback processing is performed to the conductive layer 24 to form the conductive layer 24 (the select gate line SGD).

In this step, the top surface of the conductive layer 24 is provided in the layer between the layer including the top surface of the semiconductor layer 33 and the layer including the bottom surface of the conductive layer 24. The configuration is not limited to the above, and the conductive layer 24 only has to at least be in contact with the semiconductor layer 33 and located away from the semiconductor layer 34.

Subsequently, the insulation layer 54 is formed on the top surface of the wafer, so that the step portion, which is formed between the conductive layer 24 and each of the slits SHE and SHEW and the memory pillar MP, is buried in the insulation layer 54. Afterwards, a top surface of the insulation layer 54 is flattened by, for example, CMP.

Next, processing of step S112 is performed so as to form the slit SLT, as shown in FIG. 18. Specifically, first, a mask is formed on the insulation layer 54 by, for example, photolithography. In the mask, the area for forming the slit SLT is opened. The slit SLT is formed by anisotropic etching using the formed mask.

The slit SLT formed in this step divides each of the insulation layer 54, the slit SHEW (the insulator 50), the conductive layer 24, the insulation layer 48, the sacrificial members 47, the insulation layers 46, the conductive layer 45, the insulation layer 44, the conductive layer 43, and the sacrificial member 42. The bottom of the slit SLT is in the layer where the conductive layer 41 is provided, for example.

In this step, the bottom of the slit SLT is preferably in, for example, the layer where the conductive layer 41 is provided, but only has to at least reach the layer where the sacrificial member 42 is provided. The anisotropic etching in this step is RIE, for example.

Next, processing of step S113 is performed so as to perform replacement processing of the source line SL. Specifically, first, the sacrificial member 42 is selectively removed by wet etching through the slit SLT. Subsequently, as shown in FIG. 19, a part of the multi-layered film 32 provided on the side surface of the memory pillar MP is removed through the area from which the sacrificial member 42 is removed.

The structure from which the sacrificial member 42 is removed maintains its three-dimensional structure by, for example, a plurality of memory pillars MP. In this step, the semiconductor layers 31 in the memory pillars MP are exposed in the layer from which the sacrificial member 42 is removed.

Figure 20:
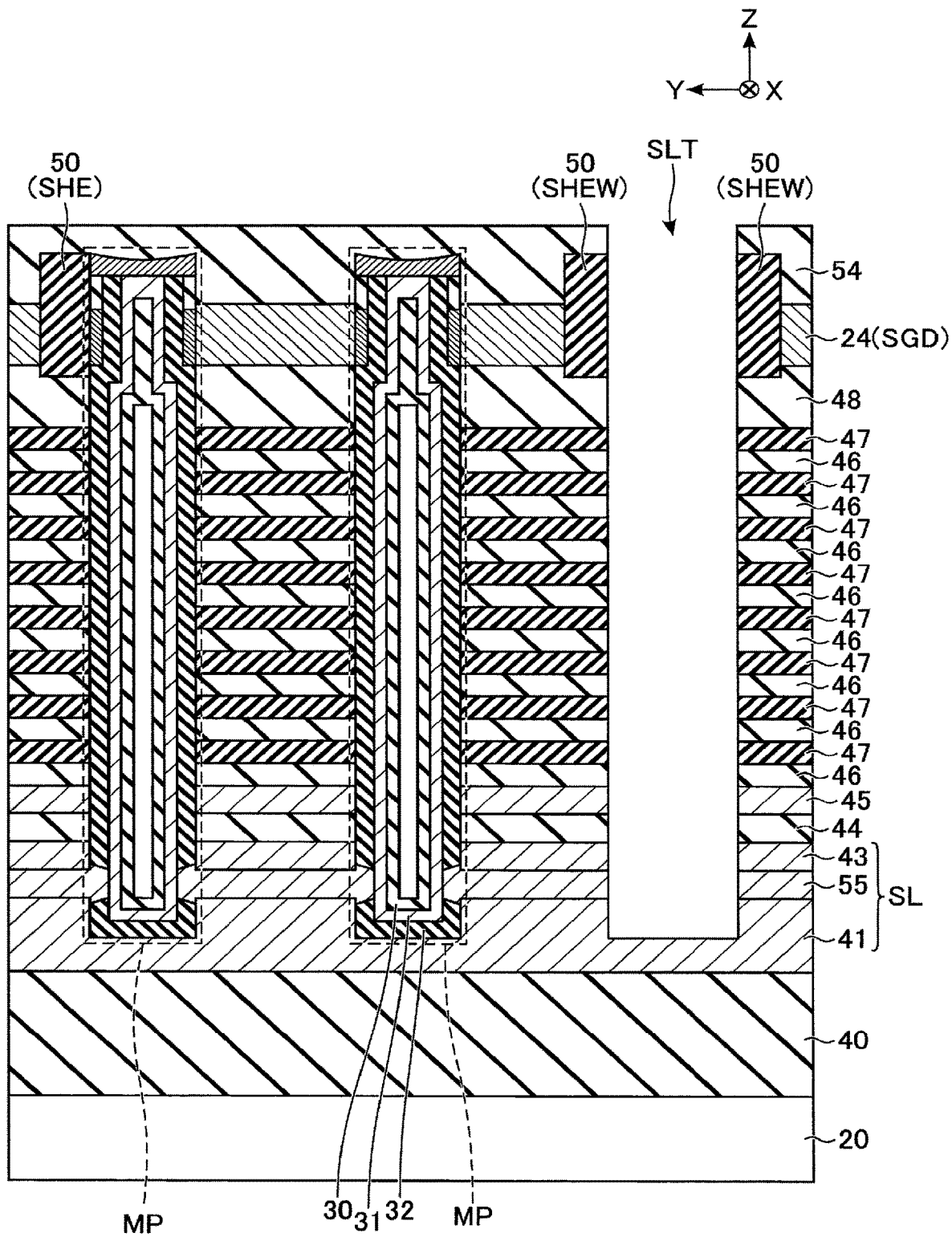

Afterwards, as shown in FIG. 20, the space from which the sacrificial member 42 is removed is filled with a conductive layer 55 by, for example, CVD (Chemical Vapor Deposition). The conductive layer 55 is formed of polysilicon doped with phosphorus, for example. Then, the conductive layer 55 formed inside the slit SLT and on the top surface of the wafer is removed by etchback processing.

By taking this step, the semiconductor layer 31 in the memory pillar MP is electrically coupled to a set of the conductive layers 41, 55, and 43. The set of the conductive layers 41, 55, and 43 corresponds to the conductive layer 21 described with reference to FIG. 4, and is used as the source line SL.

Figure 21:
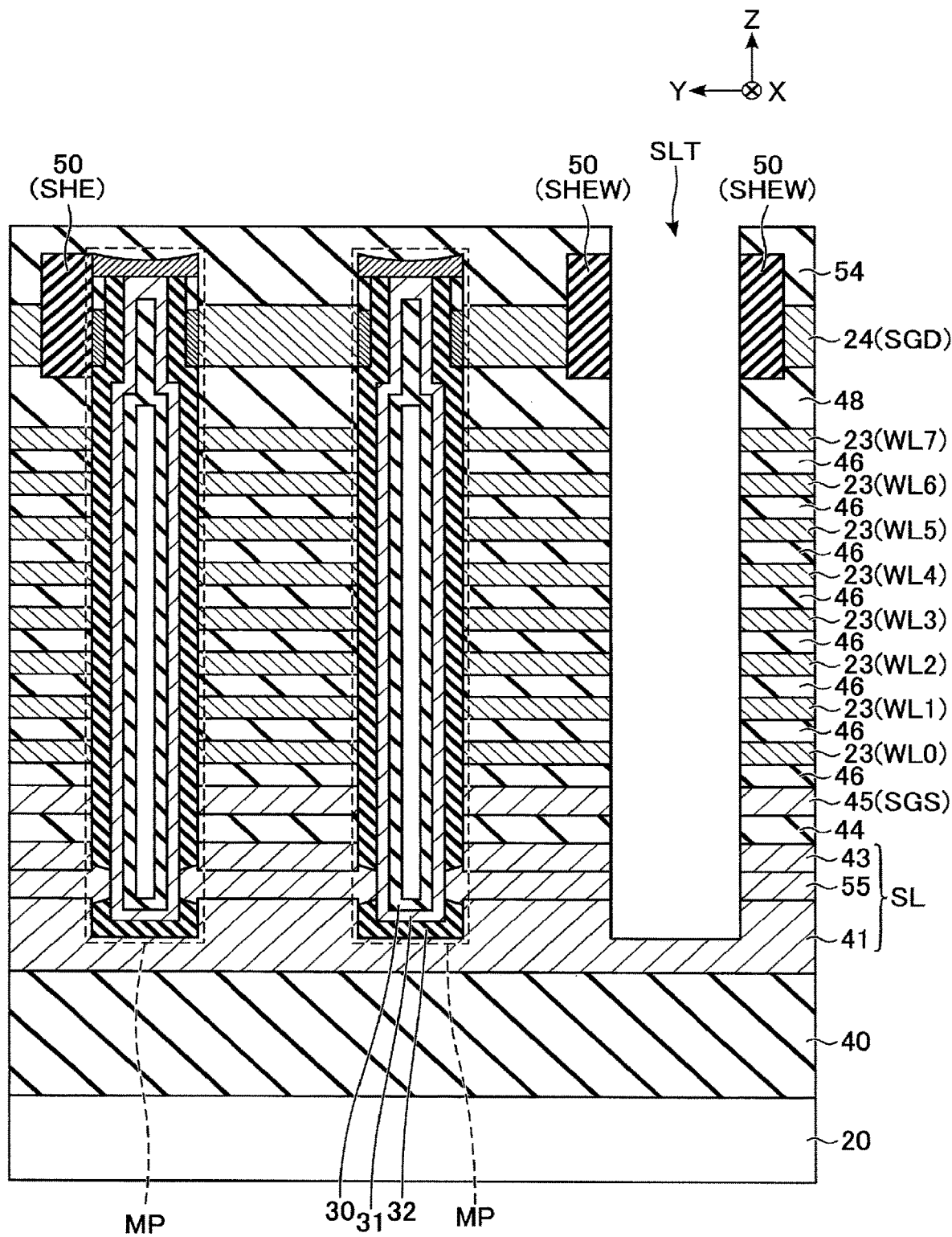

Next, as shown in FIG. 21, processing of step S114 is performed so as to perform replacement processing of the word lines. Specifically, first, the surfaces of the conductive layers 41, 55, and 43 (e.g., polysilicon) exposed inside the slit SLT are oxidized to form an oxide protective film (not shown). Afterwards, the sacrificial members 47 are removed by, for example, wet etching by hot phosphoric acid. The structure from which the sacrificial members 47 are removed maintains its three-dimensional structure by, for example, the plurality of memory pillars MP.

Then, the space from which the sacrificial member 47 is removed is filled with conductive layers 23 by, for example, CVD. Subsequently, the conductive layer 23 formed inside the slit SLT and on the top surface of the wafer is removed by etchback processing. Thus, the conductive layers 23 formed between different wires are separated from each other.

As a result, a plurality of conductive layers 23 respectively corresponding to the word lines WL0 to WL7 are formed. The conductive layers 23 formed in this step may include a barrier metal. In this case, after formation of a film of titanium nitride (TiN) as a barrier metal, tungsten (W) is formed, for example.

Figure 22:
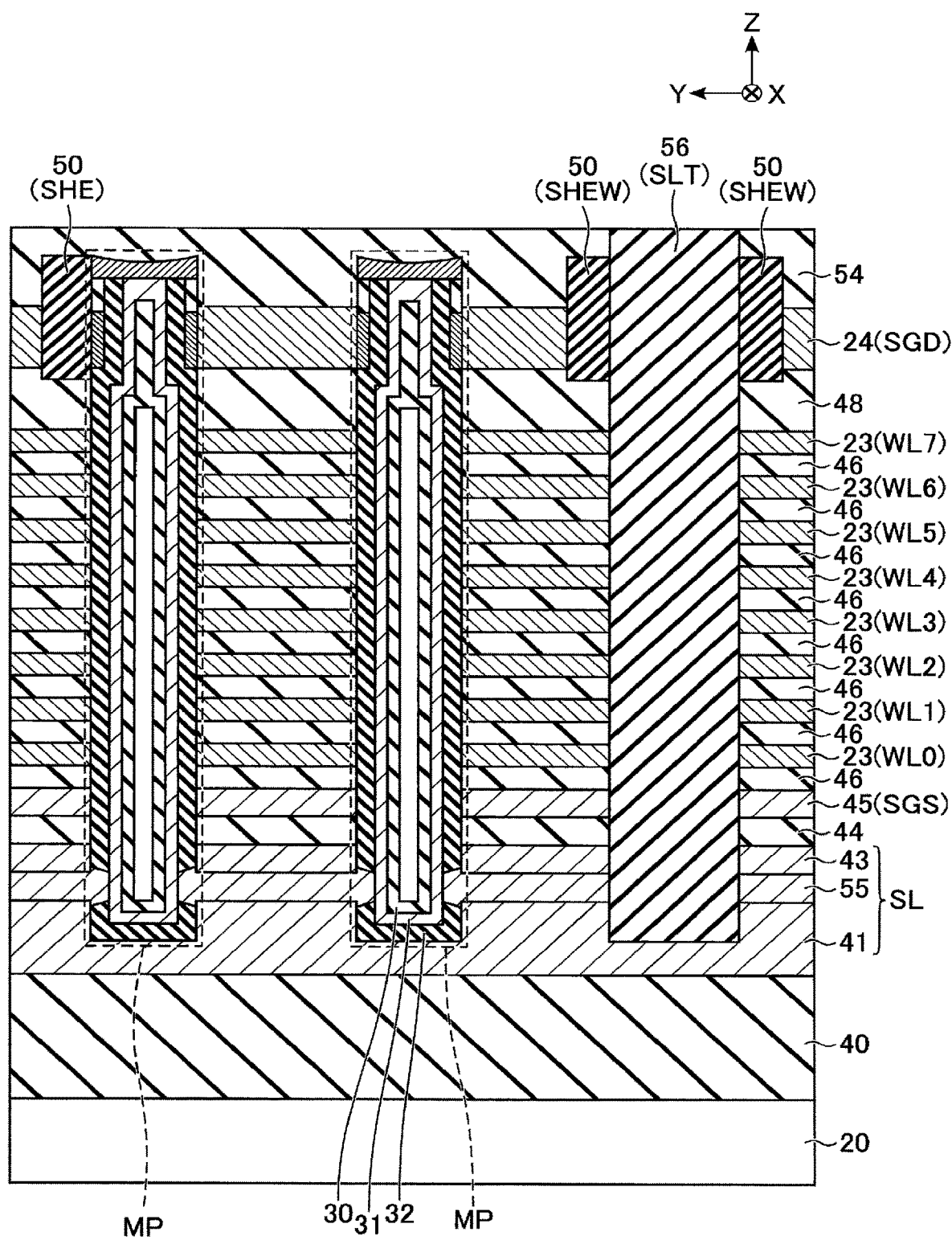

Next, as shown in FIG. 22, processing of step S115 is performed to form an insulator 56 inside the slit SLT. Specifically, first, the insulator 56 is formed on the top surface of the wafer, and the slit SLT is filled with the insulator 56. Afterwards, a top surface of the wafer is flattened by, for example, CMP. The insulator 56 includes oxide silicon ($SiO_2$), for example.

By the above-described manufacturing steps, the memory pillar MP, the source line SL coupled to the memory pillar MP, the select gate lines SGS and SGD, and the word lines WL are formed, respectively.

The manufacturing steps described above is a mere example, and another process may be inserted between any of the manufacturing steps. The amorphous silicon formed in the above manufacturing steps changes, for example, to polysilicon by heat treatment in the following manufacturing steps.

[1-3] Advantageous Effects of First Embodiment

The advantageous effects of the semiconductor memory device 1 according to a first embodiment will be described in detail.

In the semiconductor memory device in which memory cells are three-dimensionally stacked, plate-like wires used as word lines WL are stacked. And a structure functioning as a memory cell is formed in a memory pillar penetrating (passing through) the stacked wires.

In such a semiconductor memory device, for example, a plate-like select gate line SGD is formed, through which the memory pillars pass similarly to the word lines, and the operation in page units is realized by appropriately dividing the select gate line SGD. In order to increase a storage capacity per unit area of the semiconductor memory device, it is preferable to increase a positional density of the memory pillars.

However, if the positional density of the memory pillars is simply increased, it becomes difficult to form a slit SHE dividing the select gate line SGD without overlapping with memory pillars MP arranged with a high density. Generally, a slit SHE is formed after formation of the memory pillars MP, for example.

In this case, however, if the slit SHE and a memory pillar MP overlap, the area of a portion where the select transistor ST1 and the select gate line SGD are in contact with each other may vary. In other words, the characteristics of the select transistor ST1 may vary based on the area of a portion where the select transistor ST1 and the select gate line SGD are in contact with each other.

In contrast, in the semiconductor memory device 1 according to the first embodiment, the slit SHE and the memory pillar MP that divide the select gate line SGD are allowed to overlap with each other, and a cylindrical semiconductor layer 33 is provided in the memory pillar MP.

The semiconductor layer 33 is a silicone doped with a highly-concentrated impurity (e.g., boron), and is used as a gate electrode of the select transistor ST1. The semiconductor layer 33 is electrically coupled to a corresponding select gate line SGD (conductive layer 24).

In the manufacturing process of the semiconductor memory device 1 according to the first embodiment, a memory pillar MP is formed after formation of the slit SHE. Accordingly, the semiconductor layer 33 formed in the memory pillar MP is not affected by processing of the slit SHE. Thus, the variations between memory pillars MP may be reduced.

In other words, in the manufacturing method of the semiconductor memory device 1 according to the first embodiment, it is possible to make the area of the semiconductor layer 33 (a gate electrode) surrounding the semiconductor layer 31 (a channel) and the multi-layered film 32 in each select transistor ST1 uniform.

As a result, the semiconductor memory device 1 according to the first embodiment allows the slit SHE and the memory pillar MP to overlap with each other, and can reduce the variations in characteristics of the select transistors ST1. Accordingly, the semiconductor memory device according to the first embodiment may increase a storage capacity per unit area.

The semiconductor layer 33 used as a gate electrode of the select gate line SGD as described in the first embodiment can be formed in a memory pillar having other structures. In a structure of the above memory pillar, for example, a lower pillar corresponding to memory cell transistors MT may be formed, and then an upper pillar corresponding to the select transistor ST1 may be formed on the lower pillar.

However, in a memory pillar obtained by connecting the lower pillar and the upper pillar, the upper pillar may be misaligned with the lower pillar when forming the upper pillar, and a defect may be caused by the misalignment. Furthermore, in such a memory pillar, a lithography step is necessary for forming each of a hole corresponding to the lower pillar and a hole corresponding to the upper pillar, and thus the required manufacturing steps increase.

In contrast, in the manufacturing method of the semiconductor memory device 1 according to the first embodiment, a configuration corresponding to the memory cell transistors MT and a configuration corresponding to the select transistor ST1 including the semiconductor layer 33 are formed in a memory hole MH formed by performing a lithography step once. Accordingly, misalignment is not caused in the manufacturing method of the memory pillar MP in the first embodiment.

As a result, the manufacturing method of the semiconductor memory device 1 according to the first embodiment can reduce the occurrence of defects due to the memory pillar MP, and can suppress the increase in the manufacturing steps. Therefore, the manufacturing method of the semiconductor memory device 1 according to the first embodiment can improve the yield in the semiconductor memory device 1, and can reduce the manufacturing costs.

[2] Second Embodiment

In the structure of a semiconductor memory device 1 according to a second embodiment, the semiconductor layer 33 is replaced with a semiconductor film 61 described later. A manufacturing method of the semiconductor memory device 1 according to the second embodiment is different from the manufacturing method of the semiconductor memory device 1 according to the first embodiment in a method of doping with an impurity a semiconductor used as a gate electrode of the select transistor ST1. Described below is differences between the manufacturing method of the semiconductor memory device 1 according to the second embodiment and the first embodiment.

[2-1] Manufacturing Method of Semiconductor Memory Device 1

Figure 23:
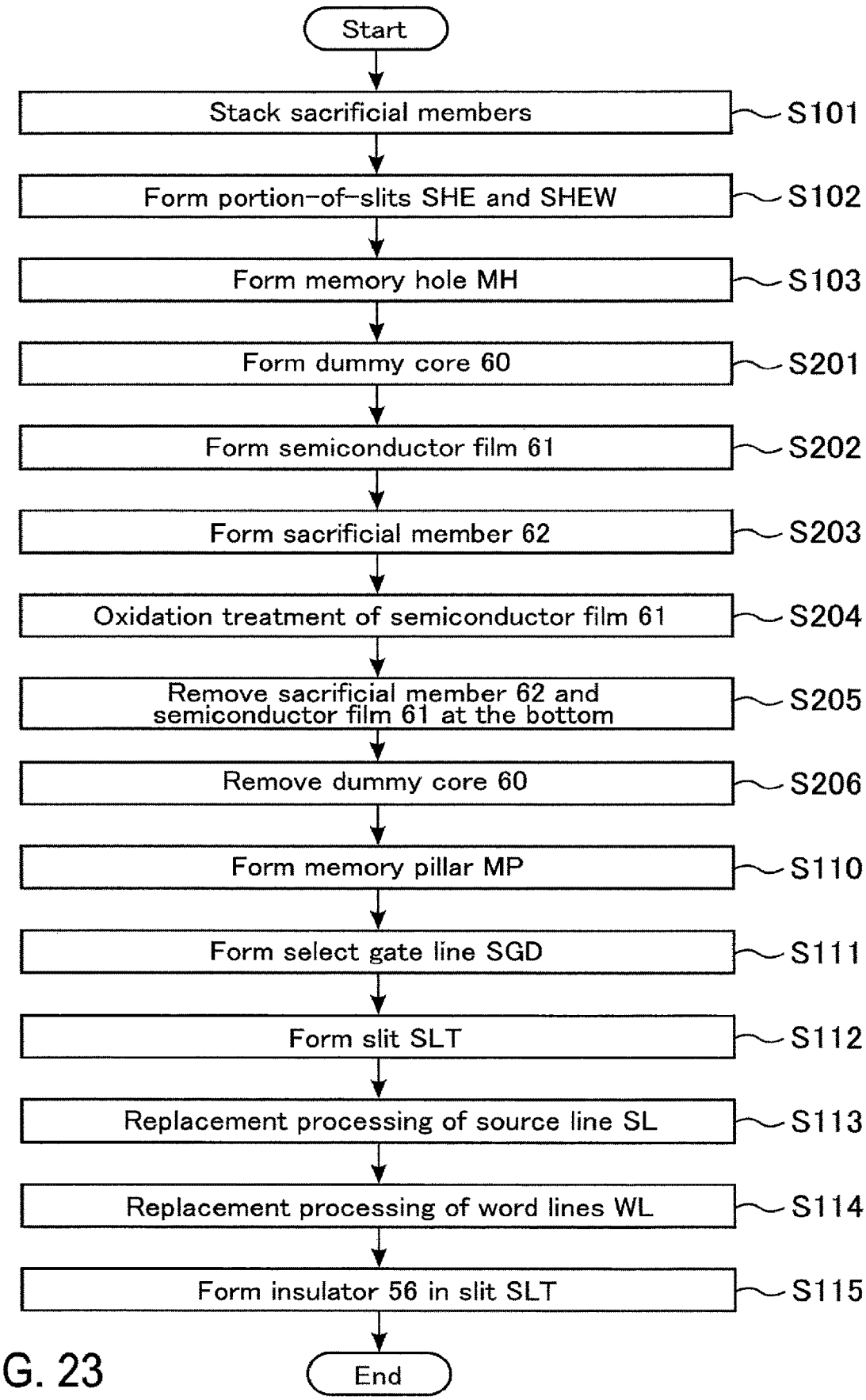
FIG. 23 is a flowchart showing an example of a manufacturing method of the semiconductor memory device according to a second embodiment.

FIG. 23 is a flowchart showing an example of a manufacturing method of the semiconductor memory device 1 according to the second embodiment. Each of FIG. 24 to FIG. 26 shows an example of a cross-sectional structure including a structure corresponding to a memory cell array 10 in a manufacturing process of the semiconductor memory device 1 according to the second embodiment.

With reference to FIG. 23, an example of the series of manufacturing steps from formation of a stacked structure corresponding to the source line SL to formation of the slit SLT in the semiconductor memory device 1 according to the second embodiment will be described.

First, processing of steps S101, S102, and S103 is sequentially performed, similarly to the first embodiment. As a result, the structure described in the first embodiment with reference to FIG. 10 is formed.

Next, the processing of step S201 is performed so as to form a dummy core 60 in a memory hole MH as shown in FIG. 24. Specifically, an insulator corresponding to the dummy core 60 is formed on the wafer, and the memory hole MH is filled with the insulator. Subsequently, etchback processing is performed to the insulator so as to remove the insulator formed on the top surface of the semiconductor film 51, and to process the insulator to have a desired height in the memory hole MH.

As a result, a structure in which the dummy core 60 is recessed in the memory hole MH is formed. The top surface of the dummy core 60 is included in the layer where the sacrificial member 49 is formed, and arranged in the vicinity of the top surface of the semiconductor layer 33 described in the first embodiment with reference to FIG. 4. The dummy core 60 includes, for example, silicon nitride (SiN).

Next, as shown in FIG. 25, a semiconductor film 61, a sacrificial member 62, and an oxide film 53 are formed.

Specifically, first, the processing of step S202 is performed so as to form the semiconductor film 61 on the top surface of the wafer and the inner wall of the memory hole MH. The film thickness of the semiconductor film 61 formed in this step corresponds to the thickness of the semiconductor layer 33 described in the first embodiment with reference to FIG. 4. The semiconductor film 61 is silicon doped with boron, for example. The type of an impurity doped into the semiconductor film 61 is not limited thereto, and the same impurities as those doped into the semiconductor layer 33 in the first embodiment may be selected.

Then, the processing of step S203 is performed so as to form the sacrificial member 62. Specifically, first, the sacrificial member 62 is formed on the wafer, and the memory hole MH is filled with the sacrificial member 62. Subsequently, etchback processing is performed to the sacrificial member 62 so as to remove the sacrificial member 62 formed on the top surface of the semiconductor film 61, and to process the sacrificial member 62 to have a desired height in the memory hole MH.

In the structure formed as a result, in which the sacrificial member 62 is recessed in the memory hole MH is formed. The top surface of the sacrificial member 62 is included in the layer where the sacrificial member 49 is formed, and is arranged in the vicinity of the top surface of the semiconductor layer 33 described in the first embodiment with reference to FIG. 4. The sacrificial member 62 includes silicon nitride (SiN), for example.

Then, the processing of step S204 is performed so as to perform oxidation treatment to the semiconductor film 61. In this step, the portion of the semiconductor film 61 that is exposed on the wafer is oxidized to form the oxide film 53. In other words, in this step, oxidation of the semiconductor film 61, which is formed on the side surface and the bottom surface of the sacrificial member 62 in the memory hole MH, is suppressed.

Next, processing of step S205 is performed as shown in FIG. 26 so that the sacrificial member 62 and the semiconductor film 61 at the bottom are removed, and then the dummy core 60 is removed. Specifically, first, the sacrificial member 62 is removed by wet etching. Subsequently, the semiconductor film 61 exposed at the bottom of the memory hole MH is removed by an anisotropic etching capable of providing a high selection ratio between the semiconductor film 61 and the oxide film 53.

As a result, the top surface of the dummy core 60 is exposed at the bottom of the memory hole MH. The semiconductor film 61 processed in this step has a structure similar to the semiconductor layer 33 described in the first embodiment with reference to FIG. 4. The processed semiconductor film 61 has a structure similar to the semiconductor layer 33, and may be referred to as the semiconductor layer 33.

Then, processing of step S206 is performed so as to remove the dummy core 60 (e.g., silicon nitride) by, for example, wet etching. Afterwards, similarly to the first embodiment, the processing of steps S110, S111, S112, S113, S114, and S115 is sequentially performed. As a result, a structure similar to the structure described in the first embodiment with reference to FIG. 4.

[2-2] Advantageous Effects of Second Embodiment

The advantageous effects of the semiconductor memory device 1 according to a second embodiment will be described in detail.

In the manufacturing method of the semiconductor memory device 1 according to the first embodiment, the non-doped semiconductor film 51 is first formed in the memory pillar MP. Then, the semiconductor layer 31 doped with an impurity is formed by the ion implantation processing to the non-doped semiconductor film 51.

In contrast, in the manufacturing method of the semiconductor memory device 1 according to the second embodiment, the semiconductor film 61 doped with an impurity in advance is formed in the memory hole MH. Then, the semiconductor film 61 is processed into a shape similar to the semiconductor layer 31 of the first embodiment.

The semiconductor film 61 processed in such a manner is electrically coupled to the conductive layer 24 in the later manufacturing step, and the semiconductor film 61 can be used as the gate electrode (the semiconductor layer 31) of the select transistor ST1 similarly to the first embodiment.

The semiconductor memory device 1 according to the second embodiment has a configuration similar to that of the semiconductor memory device 1 according to the first embodiment. Thus, the manufacturing method of the semiconductor memory device 1 according to the second embodiment can achieve advantageous effects similar to the first embodiment.

[3] Third Embodiment

In a semiconductor memory device 1 according to a third embodiment, a polysilicon electrode is provided on the lower side of the conductive layer 24 corresponding to the select gate line SGD, compared with the structure of the semiconductor memory device 1 according to the first embodiment. In the following, differences between the semiconductor memory device 1 according to the third embodiment and the first and second embodiments will be described.

[3-1] Configuration of Memory Cell Array 10

Figure 27:
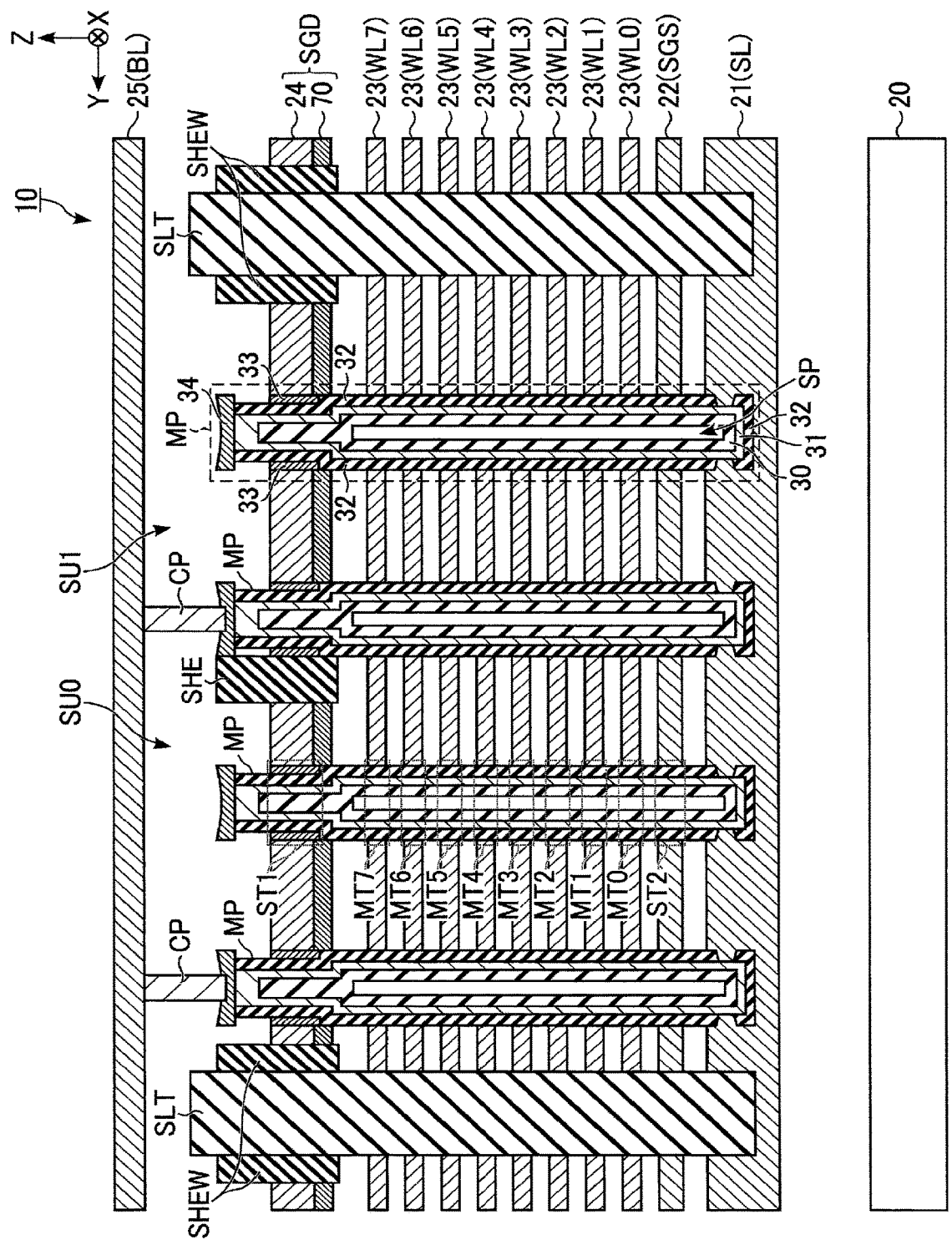
FIG. 27 is a cross-sectional view showing an example of a cross-sectional structure of a memory cell array included in a semiconductor memory device according to a third embodiment.

FIG. 27 shows an example of a cross-sectional structure of a memory cell array 10 included in the semiconductor memory device 1 according to the third embodiment. As shown in FIG. 27, in the structure of the memory cell array 10 in the semiconductor memory device 1 according to the third embodiment, a semiconductor layer 70 is added to the structure of the memory cell array 10 described in the first embodiment with reference to FIG. 4.

Specifically, the semiconductor layer 70 is provided in a layer between the layer where the uppermost conductive layer 23 is provided and the layer where the conductive layer 24 is provided. The semiconductor layer 70 is in contact with both the bottom surface of the conductive layer 24 and the bottom portion of the semiconductor layer 33 provided in the memory pillar MP. In other words, the semiconductor layer 70 is electrically coupled to the conductive layer 24 and the semiconductor layer 33.

The semiconductor layer 70 is silicon (Si) doped with boron (B), for example. An impurity doped into the semiconductor layer film 70 is not limited to boron, and other impurities such as phosphorus (P) and arsenic (As) may be used in accordance with the impurity used for the semiconductor layer 33. The semiconductor layer 70 is doped with a P-type impurity if the impurity doped into the semiconductor layer 33 is a P-type impurity (e.g., boron), and the semiconductor layer 70 is doped with an N-type impurity if the impurity doped into the semiconductor layer 33 is an N-type impurity (e.g., phosphorus).

The density of the impurity doped into the semiconductor layer 70 is, for example, $10^{19}$ atoms/cm$^3$ or higher. A contact resistance between the semiconductor layer 70 and the conductive layer 24 may decrease as the density of the impurity doped into the semiconductor layer 70 increases.

In the third embodiment, the memory pillar MP penetrates (passes through) the semiconductor layer 70. Similarly, each of the slit SHE and the slit SHEW divides the semiconductor layer 70. In the semiconductor memory device 1 according to the third embodiment, a set of the semiconductor layer 33 and the semiconductor layer 70 is used as a gate electrode of the select transistor ST1.

The other configurations of the semiconductor memory device 1 according to the third embodiment are the same as those of the semiconductor memory device 1 according to the first embodiment; therefore, the descriptions thereof are omitted.

[3-2] Manufacturing Method of Semiconductor Memory Device 1

Figure 28:
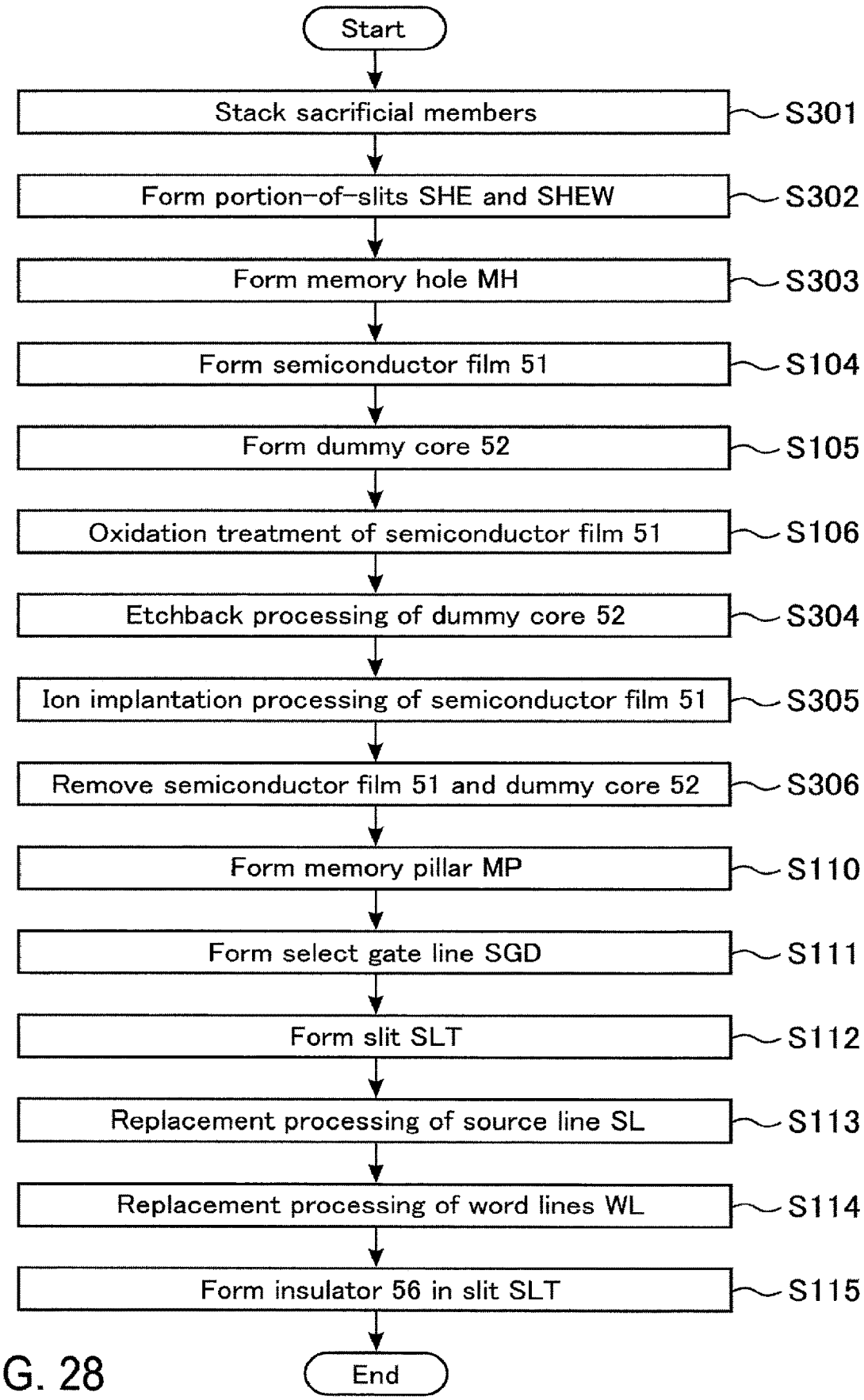
FIG. 28 is a flowchart showing an example of a manufacturing method of the semiconductor memory device according to the third embodiment.

FIG. 28 is a flowchart showing an example of a manufacturing method of the semiconductor memory device 1 according to the third embodiment. Each of FIG. 29 to FIG. 32 shows an example of a cross-sectional structure including a structure corresponding to the memory cell array 10 in a manufacturing process of the semiconductor memory device 1 according to the third embodiment.

With reference to FIG. 28, an example of the series of manufacturing steps, from formation of a stacked structure corresponding to the source line SL to formation of the slit SLT in the semiconductor memory device 1 according to the third embodiment, will be described.

Figure 29:
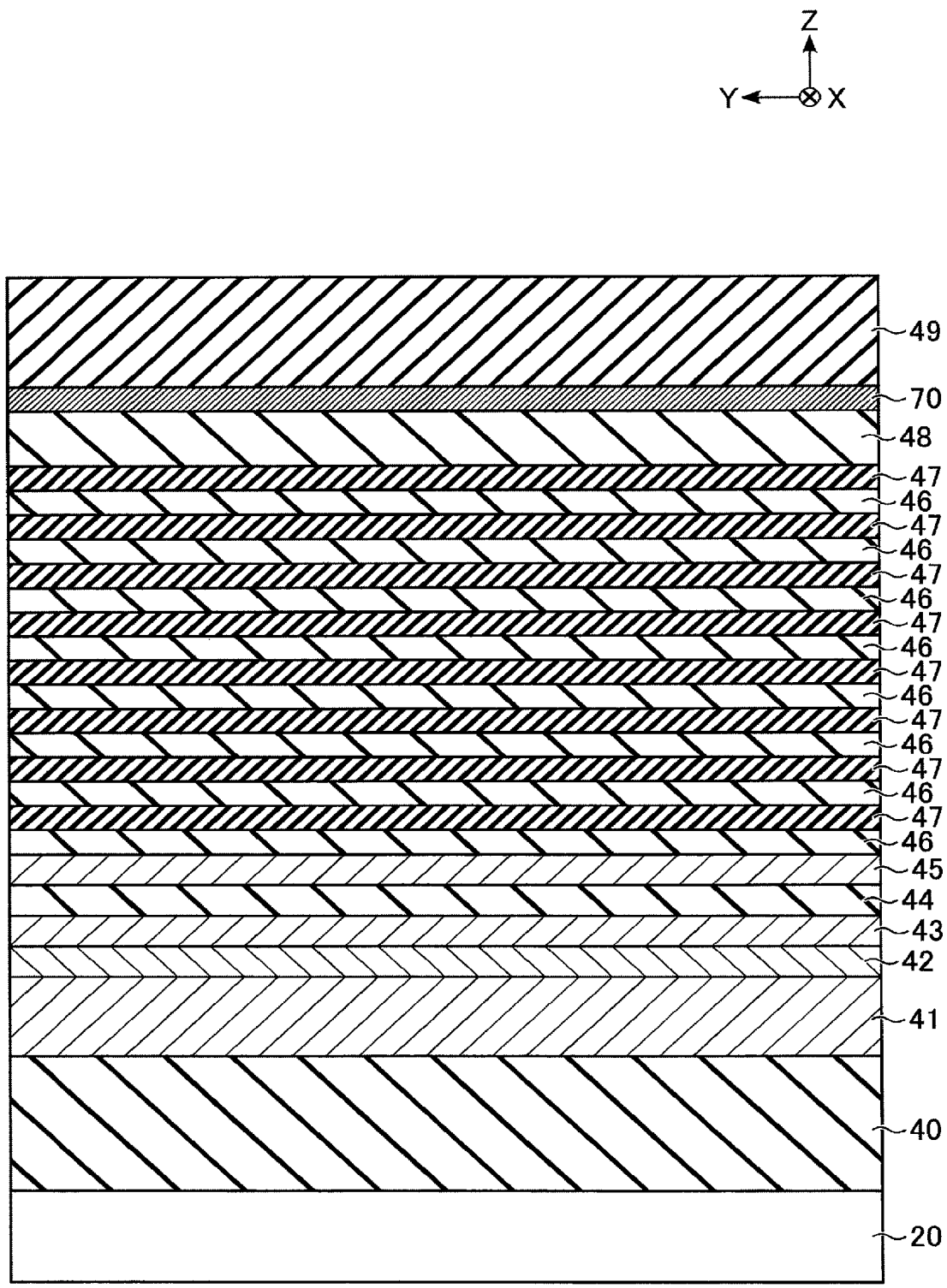

First, processing of step S301 is performed so as to stack a plurality of sacrificial members respectively corresponding to the source line SL, word lines WL, and select gate lines SGS and SGD, as shown in FIG. 29. Specifically, first, the insulation layer 40, the conductive layer 41, the sacrificial member 42, the conductive layer 43, the insulation layer 44, and the conductive layer 45 are formed in order on the semiconductor substrate 20, the insulation layers 46 and the sacrificial members 47 are alternately stacked on the conductive layer 45, and the insulation layer 48 is formed on the uppermost sacrificial member 47, similarly to the first embodiment. Then, in the manufacturing method of the semiconductor memory device 1 according to the third embodiment, the semiconductor layer 70 is formed on the insulation layer 48, and the sacrificial member 49 is formed on the semiconductor layer 70.

Figure 30:
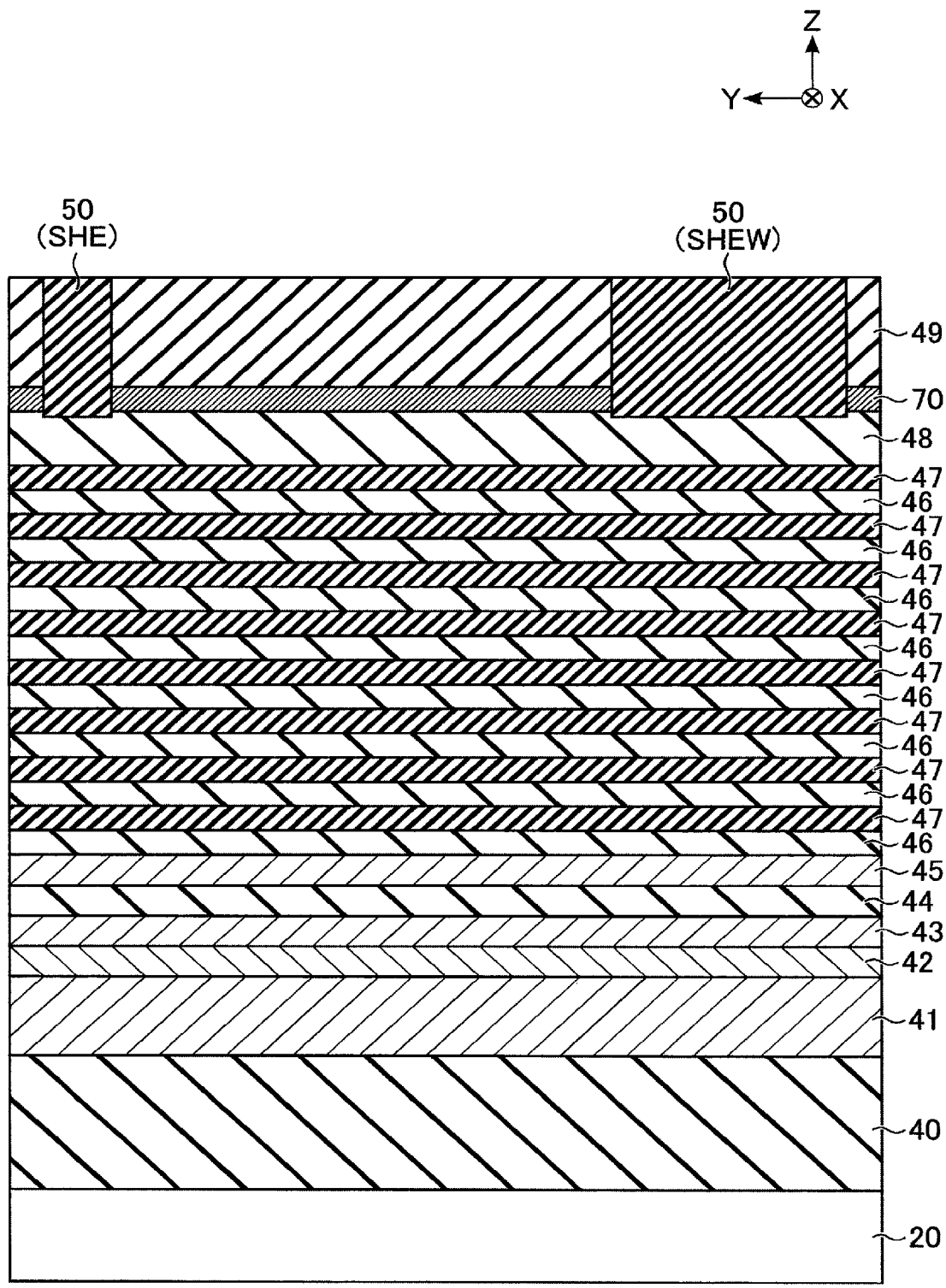

Next, processing of step S302 is performed to form the portion-of-slits SHE and SHEW, as shown in FIG. 30. Specifically, first, a mask is formed by, for example, photolithography, similarly to the first embodiment. In the mask, the areas corresponding to the slits SHE and SHEW are opened. Then, the slits SHE and SHEW are formed by anisotropic etching using the formed mask.

The slits SHE and SHEW formed in this step divides each of the sacrificial member 49 and the semiconductor layer 70. The bottom of each of the slits SHE and SHEW is in, for example, the insulation layer 48.

Then, the insulator 50 is formed on the wafer, and the insulator 50 formed on the outside of the slits SHE and SHEW is removed, similarly to the first embodiment. As a result, a structure in which each of the slits SHE and SHEW is filled with the insulator 50 is formed.

Next, as shown in FIG. 31, memory holes MH, the semiconductor film 51, the dummy core 52, the oxide film 53, the semiconductor layer 33 are formed. Specifically, first, processing of step S303 is performed so as to form the memory holes MH.

A memory hole MH formed in this step penetrates the sacrificial member 49, the semiconductor layer 70, the insulation layer 48, the plurality of sacrificial members 47, the plurality of insulation layers 46, the conductive layer 45, the insulation layer 44, the conductive layer 43, and the sacrificial member 42, for example.

A bottom of the memory hole MH is in the layer where the conductive layer 41 is provided, for example. When a memory hole MH overlapping with the slit SHE is formed, a part of the slit SHE is removed. The anisotropic etching in this step is RIE, for example.

Then, processing of steps S104, S105, and S106 is sequentially performed, similarly to the first embodiment. As a result, the semiconductor film 51 and the dummy core 52 are formed, and the oxide film 53 is formed by oxidation treatment to the semiconductor film 51, similarly to the first embodiment.

Afterwards, processing of step S304 is performed so as to perform etchback processing to the dummy core 52. In this step, for example, the dummy core 52 is processed so that the top surface of the dummy core 52 is included in the layer where the semiconductor layer 70 is formed. However, the configuration is not limited thereto, and the top surface of the dummy core 52 may be included in the layer where the insulation layer 48 is provided.

Then, processing of step S305 is performed so as to perform ion implantation processing to the semiconductor film 51. In this step, for example, boron is injected into the semiconductor film 51 exposed in the memory hole MH, similarly to the first embodiment. In the structure formed as a result of the above step, the semiconductor layer 33 doped with an impurity is provided on a side surface of the memory hole MH, and the semiconductor layer 33 is in contact with the semiconductor layer 70.

Next, processing of step S306 is performed so as to remove the semiconductor film 51 and the dummy core 52, as shown in FIG. 32. Specifically, first, the dummy core 52 (silicon nitride) is removed by, for example, wet etching. Afterwards, the semiconductor film 51 (amorphous silicon) is removed by, for example, wet etching.

In the wet etching in this step, an etching solution capable of providing a high selection ratio between the semiconductor film 51 and the semiconductor layers 33 and 70 is used. Accordingly, as the impurity doped into the semiconductor layer 33 in step S305, a material capable of having a high selection ratio in this step is selected.

Next, processing of steps S110, S111, S112, S113, S114, and S115 is performed in order, similarly to the first embodiment. As a result, a structure similar to the structure described with reference to FIG. 27 is formed.

[3-3] Advantageous Effects of Third Embodiment

The advantageous effects of the semiconductor memory device 1 according to a third embodiment will be described in detail.

In the semiconductor memory device 1 according to the first embodiment, the height of the semiconductor layer 33 formed in a memory pillar MP is controlled based on the height of the dummy core 52. The height of the dummy core 52 is controlled based on the height of the insulator corresponding to the dummy core 52 when the insulator is formed, and on the etched-back amount of the insulator. Accordingly, the height of the dummy core 52 is affected by the variations in a plurality of steps. In the semiconductor memory device 1 according to the first embodiment, the height of the semiconductor layer 33 varies between production lots due to such an effect, and the characteristics of the select transistor ST1 may vary.

In contrast, in the semiconductor memory device 1 according to the third embodiment, the semiconductor layer 70 in contact with the semiconductor layer 33 in the memory pillar MP is provided on the bottom surface of the conductive layer 24 used as the select gate line SGD. In the semiconductor memory device 1 according to the third embodiment, the bottom end of the gate electrode of the select transistor ST1 is determined by a position of the semiconductor layer 70.

Since the height of the semiconductor layer 70 is controlled solely by the film forming step, the variations in the height of the semiconductor layer 70 is small. In other words, in the semiconductor memory device 1 according to the third embodiment, it is possible to reduce the variations in a position of the bottom end of the gate electrode of the select transistor ST1 between production lots.

As a result, the semiconductor memory device 1 according to the third embodiment can achieve advantageous effects similar to the first embodiment, and can reduce the variations in characteristics of the select transistors ST1 between production lots.

[4] Fourth Embodiment

In a semiconductor memory device 1 according to a fourth embodiment, a High-k film is provided on the inner wall and the bottom surface of the semiconductor layer 33 in the memory pillar MP, compared with the structure of the semiconductor memory device 1 according to the first embodiment. In the following, differences of the semiconductor memory device 1 according to the fourth embodiment from the first to third embodiments will be described.

[4-1] Structure of Memory Cell Array 10

Figure 33:
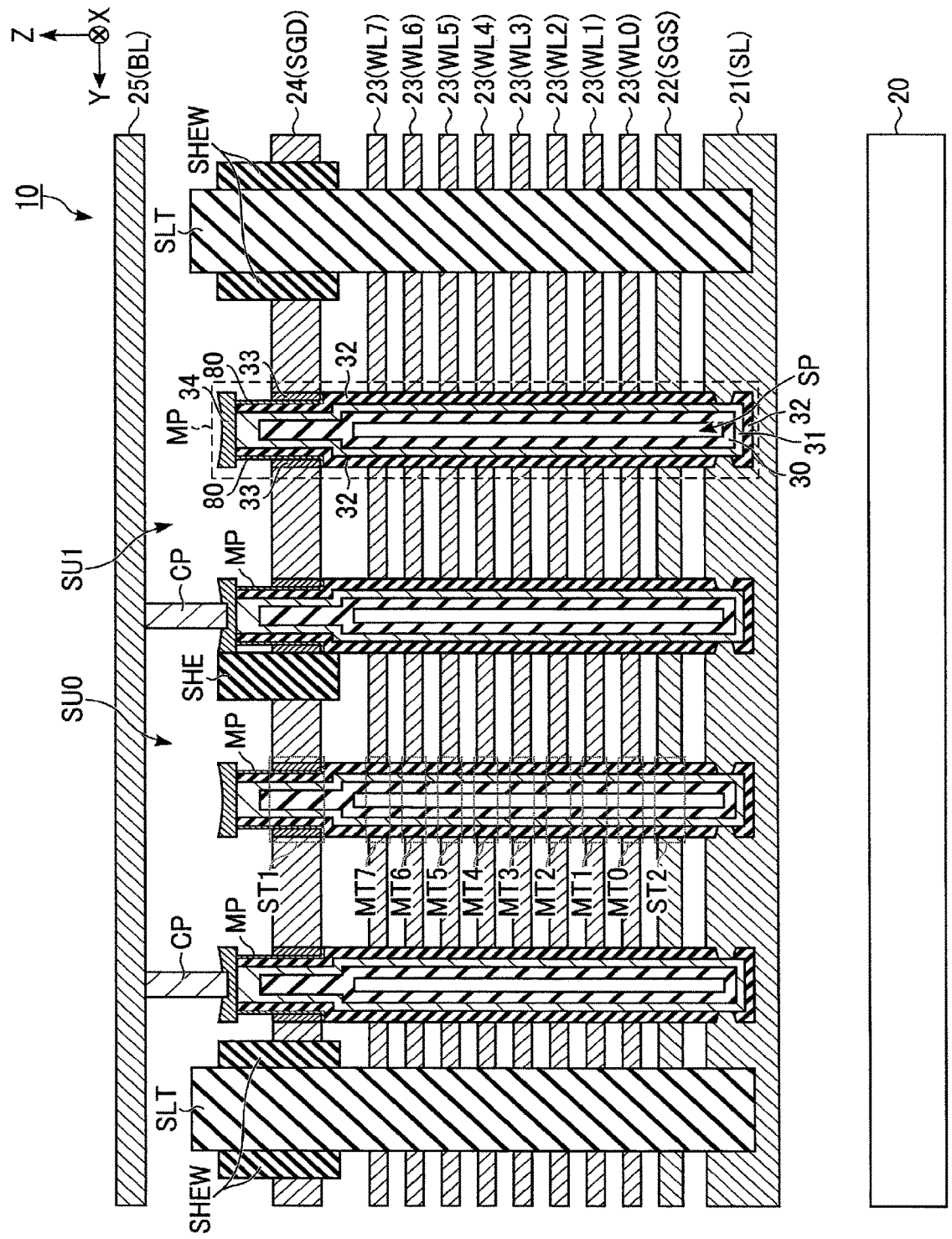
FIG. 33 is a cross-sectional view showing an example of a cross-sectional structure of a memory cell array included in a semiconductor memory device according to a fourth embodiment.

FIG. 33 shows an example of a cross-sectional structure of a memory cell array 10 included in a semiconductor memory device 1 according to the fourth embodiment. As shown in FIG. 33, in the structure of the memory cell array 10 in the semiconductor memory device 1 according to the fourth embodiment, a High-k film 80 is added to the structure of the memory cell array 10 described in the first embodiment with reference to FIG. 4.

The High-k film 80 is provided between the multi-layered film 32 and the semiconductor layer 33 in each memory pillar MP. The semiconductor layer 70 is in contact with each of the side surface of the multi-layered film 32 and the inner wall and the bottom surface of the semiconductor layer 33.

The High-k film 80 is, for example, titanium nitride (TiN), and is used as a barrier metal or an etching-resistant material. However, the configuration is not limited thereto, and the High-k film 80 may be made of other materials as long as the High-k film 80 can be used as a barrier metal or an etching-resistant material.

The other configurations of the semiconductor memory device 1 according to the fourth embodiment are the same as those of the semiconductor memory device 1 according to the first embodiment; therefore, the descriptions thereof are omitted.

[4-2] Manufacturing Method of Semiconductor Memory Device 1

Figure 34:
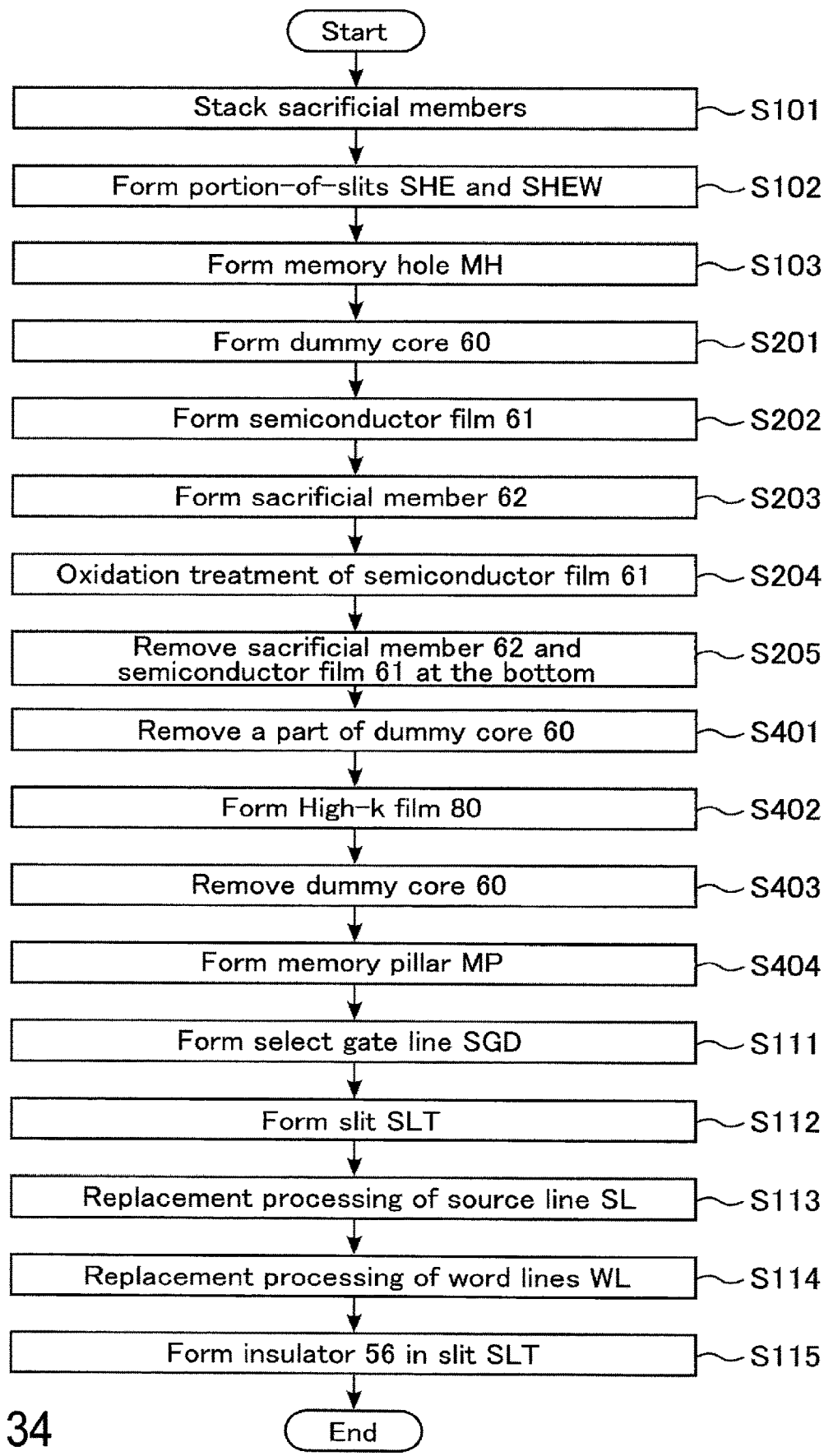
FIG. 34 is a flowchart showing an example of a manufacturing method of the semiconductor memory device according to the fourth embodiment.

FIG. 34 is a flowchart showing an example of a manufacturing method of the semiconductor memory device 1 according to the fourth embodiment. Each of FIG. 35 to FIG. 39 shows an example of a cross-sectional structure including a structure corresponding to the memory cell array 10 in a manufacturing process of the semiconductor memory device 1 according to the fourth embodiment.

With reference to FIG. 34, an example of the series of manufacturing steps from formation of a stacked structure corresponding to the source line SL to formation of the slit SLT in the semiconductor memory device 1 according to the fourth embodiment will be described.

First, processing of steps S101, S102, and S103 is performed in order, similarly to the first embodiment. As a result, a structure described in the first embodiment with reference to FIG. 10 is formed.

Next, processing of steps S201, S202, S203, S204, and S205 is performed in order, similarly to the second embodiment. As a result, a structure described in step S205 of the second embodiment is formed. In the drawings referred to below, the semiconductor film 61 formed in the above sequence of process is shown as the semiconductor layer 33.

Next, processing of step S401 is performed to remove a part of the dummy core 60, as shown in FIG. 35. In particular, a minute amount of the dummy core 60 is removed by, for example, wet etching in which the dummy core 60 has a high selection ratio. As a result, the dummy core 60 in contact with the bottom surface of the semiconductor layer 33 is removed, and a structure in which the semiconductor layer 33 is separated from the dummy core 60 is formed.

Next, processing of step S402 is performed to form the High-k film 80, as shown in FIG. 36. Specifically, first, the High-k film 80 is formed on the top surface of the wafer and the inner wall of the memory hole MH by, for example, CVD (Chemical Vapor Deposition). In this step, the High-k film 80 may be formed to cover at least the exposed part of the semiconductor layer 33.

Next, a part of the High-k film 80 and the dummy core 60 are removed, as shown in FIG. 37. Specifically, first, the High-k film 80 formed at the bottom of the memory hole MH is removed by, for example, anisotropic etching. As a result, the top surface of the dummy core 60 is exposed at the bottom of the memory hole MH.

The High-k film 80 formed on the top surface of the wafer may be removed in this step. In this step, the High-k film 80 may remain at least on the exposed part on the side surface inside the memory hole MH.

Then, processing of step S403 is performed to remove the dummy core 60. In this step, wet etching solution providing a high selection ratio between the High-k film 80 and the dummy core 60 is performed, and the High-k film 80 remains.

Next, processing of step S404 is performed to form a memory pillar MP. Specifically, first, for example, the multi-layered film 32 (the block insulation film 37, the insulation film 36, and the tunnel oxide film 35) and the semiconductor layer 31 are formed in this order on each of the top surface of the wafer and the inner wall of the memory hole MH, similarly to the first embodiment. Then, the core member 30 formed on the wafer is removed, and the core member 30 formed in the memory hole MH is recessed. Then, the part where the core member 30 is recessed is filled with the semiconductor layer 31.

In the structure formed as a result of the above step, the top surface of the core member 30 is located in the layer where the sacrificial member 49 is provided, is located in a higher layer than the upper surface of the semiconductor layer 33, and is covered by the semiconductor layer 31, as shown in FIG. 38.

Subsequently, the semiconductor layer 31, the multi-layered film 32, the High-k film 80, and the oxide film 53 that are formed on the top surface of the wafer are removed, and the upper part of the structure formed in the memory hole MH is recessed. Afterwards, the semiconductor layer 34 is formed on the top surface of the wafer, and then etched back, similarly to the first embodiment.

In the structure formed as a result, the semiconductor layer 34 is provided on the top surfaces of the semiconductor layer 31, the multi-layered film 32, the High-k film 80, and the oxide film 53 is formed in the memory hole MH, as shown in FIG. 39. The structure formed in the memory hole MH in this step corresponds to the structure of the memory pillar MP described with reference to FIG. 33.

Afterwards, processing of steps S111, S112, S113, S114, and S115 is performed in order, similarly to the first embodiment. As a result, a structure similar to the structure described with reference to FIG. 33 is formed.

[4-3] Advantageous Effects of Fourth Embodiment

As described above, in the semiconductor memory device 1 according to the fourth embodiment, a High-k film 80 is added to the structure of the memory pillar MP described regarding the semiconductor memory device 1 according to the first embodiment.

The High-k film 80 can protect the gate electrode (the semiconductor layer 33) of the select transistor ST1 in the manufacturing process of the semiconductor memory device 1 according to the fourth embodiment. Thus, in the semiconductor memory device 1 according to the fourth embodiment, variations in the shape of the semiconductor layer 33 may be reduced.

In other words, in the manufacturing method of the semiconductor memory device 1 according to the fourth embodiment, variations in the structure around the gate electrode of the select transistor ST1 may be reduced. Thus, the semiconductor memory device 1 according to the fourth embodiment can achieve advantageous effects similar to the first embodiment, and can reduce the variations in the characteristics of the select transistors ST1.

In the fourth embodiment, the case is exemplified where the semiconductor film 61 doped with an impurity in advance is formed similarly to the manufacturing method of the semiconductor memory device 1 according to the second embodiment. However, the configuration is not limited thereto.

For example, the structure of the semiconductor memory device 1 according to the fourth embodiment may be formed by performing the ion implantation processing to the semiconductor film 51 after forming the non-doped semiconductor film 51, similarly to the manufacturing method of the semiconductor memory device 1 according to the first embodiment.

In such a case, a part of the dummy core 52 and a part of the semiconductor film 51 are removed after, for example, the manufacturing step described in the first embodiment with reference to FIG. 12, and the bottom surface of the semiconductor layer 33 is exposed. Next, processing of step S402 is performed so as to form the High-k film 80 to cover the semiconductor layer 33.

Then, the High-k film 80 formed at the bottom of the memory hole MH is removed, and processing of step S109 is performed. The following manufacturing process is the same as the manufacturing process in the manufacturing method of the semiconductor memory device 1 according to the first embodiment; therefore, the descriptions thereof are omitted.

[5] Modifications

A semiconductor device according to an embodiment includes a plurality of first conductive layers, a second conductive layer, a first semiconductor layer, a multi-layered body, and a third conductive layer. The plurality of first conductive layers (For example, 23 in FIG. 4) are provided one above the other in a first direction. Each of the first conductive layers is extending in a second direction intersecting the first direction. The second conductive layer (For example, 24 in FIG. 4) is provided above an uppermost layer of the first conductive layers. The first semiconductor layer (For example, 31 in FIG. 4) is extending in the first direction. The multi-layered body (For example, 32 in FIG. 4) includes a charge storage layer. The multi-layered body is provided between the first semiconductor layer and the first conductive layers, and between the first semiconductor layer and the second conductive layer. The third conductive (For example, 33 in FIG. 4) layer is provided between the multi-layered body and the second conductive layer in the second direction. The third conductive layer is electrically coupled to the second conductive layer. The first semiconductor layer includes a first portion facing the uppermost layer of the first conductive layers and a second portion facing the second conductive layer. The first semiconductor layer is continuous at least from the first portion to the second portion. In the semiconductor memory device according to the embodiments, it is possible to increase a storage capacity per unit area.

The third embodiment and the fourth embodiment can be combined with each other. Accordingly, the semiconductor memory device 1 may include both the semiconductor layer 70 described in the third embodiment, and the High-k film 80 described in the fourth embodiment. In this case, the semiconductor memory device 1 can achieve both the advantageous effects of the third embodiment and the advantageous effects of the fourth embodiment.

The structure of the memory cell array 10 in the above embodiments may be a different structure. For example, in the structure of the memory pillar MP, a plurality of pillars may be connected in the Z-axis direction. In this case, in the structure of the memory pillar MP, for example, a pillar penetrating the conductive layer 24 (the select gate line SGD) and the plurality of conductive layers 23 (the word lines WL) may be connected to a pillar penetrating the plurality of conductive layers 23 (the word lines WL) and the conductive layer 24 (the select gate line SGS). Furthermore, the memory pillar MP may include a plurality of pillars each penetrating a plurality of conductive layers 23.

In the above embodiments, the case is described as an example where a circuit, such as the sense amplifier module 16, is provided below the memory cell array 10 in the structure of the semiconductor memory device 1. However, the configuration is not limited thereto. For example, in the structure of the semiconductor memory device 1, the memory cell array 10 and the sense amplifier module 16 may be formed on the semiconductor substrate 20. In this case, in the memory pillar MP, the semiconductor layer 31 is electrically coupled to the source line SL via, for example, the bottom surface of the memory pillar MP.

The semiconductor layer 33 in the semiconductor memory device 1 of the above embodiments is used as a conductive layer, and may be formed of, for example, a metal layer. The semiconductor memory device 1 can achieve the advantageous effects similar to those of the above embodiments even if the semiconductor layer 33 is replaced with, for example, a metal layer.

In the present description, the term "High-k film" indicates a high-dielectric material. The dielectric constant of the High-k film is higher than the dielectric constant of the oxide silicon (S102). The term "High-k film" may be referred to as "High-k material" or "high-dielectric film."

In the above embodiments, the term "dummy core" indicates a material temporarily formed in the memory hole MH, and the term "sacrificial member" indicates a material used for replacement processing of wires including the word lines WL and the select gate line SGD. However, the meaning is not limited thereto, and the term "dummy core" may be referred to as "sacrificial member."

In the present description, the term "coupled" means an electrical coupling, and does not exclude a coupling with an element being interposed in the coupling, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of first conductive layers provided one above the other in a first direction, each of the first conductive layers extending in a second direction intersecting the first direction;
   a second conductive layer above an uppermost layer of the first conductive layers;
   a first semiconductor layer extending in the first direction;
   a multi-layered body including a charge storage layer, the multi-layered body provided between the first semiconductor layer and the first conductive layers, and between the first semiconductor layer and the second conductive layer; and
   a third conductive layer provided between the multi-layered body and the second conductive layer in the second direction, the third conductive layer being electrically coupled to the second conductive layer; and
   a first insulating film provided above the third conductive layer and between the multi-layered body and the second conductive layer in the second direction,
   wherein the first semiconductor layer includes a first portion facing the plurality of the first conductive layers, a second portion facing the second conductive layer, a third portion facing the first insulating film, and the first semiconductor layer is continuous from the first portion to the third portion through the second portion.

2. The device of claim 1, wherein an interval between the uppermost layer of the first conductive layers and the second conductive layer in the first direction is wider than an interval between two adjacent first conductive layers of the first conductive layers in the first direction.

3. The device of claim 1, wherein the multi-layered body is a continuous film from a portion facing the uppermost first conductive layer to the second portion facing the second conductive layer.

4. The device of claim 1, wherein the third conductive layer is formed in a cylindrical shape.

5. The device of claim 1, wherein a side surface of the third conductive layer is aligned with a side surface of the multi-layered body in contact with a bottom surface of the third conductive layer.

6. The device of claim 1, wherein the multi-layered body includes a tunnel oxide film in contact with the first semiconductor layer, a block insulation film in contact with the third conductive layer, and an insulation film between the tunnel oxide film and the block insulation film.

7. The device of claim 1, further comprising:
   a first insulation layer extending in the first direction and covered with the first semiconductor layer.

8. The device of claim 7, wherein
   an outer diameter of the first insulation layer in a layer where one of the first conductive layers is provided is larger than an outer diameter of the first insulation layer in a layer where the second conductive layer is provided, and
   a thickness of the first semiconductor layer in a layer where one of the first conductive layers is provided is approximately equal to a thickness of the first semiconductor layer in a layer where the second conductive layer is provided.

9. The device of claim 7, wherein the first insulation layer is formed in a cylindrical shape at a position crossing one of the first conductive layers that are stacked.

10. The device of claim 7, further comprising:
a second semiconductor layer in contact with a top surface of each of the first insulating film, the first semiconductor layer, and the multi-layered body.

11. The device of claim 10, wherein
a side surface of the third conductive layer is aligned with a side surface of the second semiconductor layer, and
the third conductive layer and the second semiconductor layer are insulated from each other by the first insulating film.

12. The device of claim 1, further comprising:
a slit that divides the second conductive layer and that is in contact with the third conductive layer, the slit being provided with an insulator therein.

13. The device of claim 6, wherein a top surface of the first insulation layer is included in a higher layer than a layer where the second conductive layer is provided.

14. The device of claim 1, wherein
a portion where each of the first conductive layers crosses the first semiconductor layer functions as a memory cell transistor, and
a portion where the second conductive layer crosses the first semiconductor layer functions as a select transistor.

15. The device of claim 1, wherein
the third conductive layer is a semiconductor containing boron, and
a density of boron in the third conductive layer is $10^{19}$ atoms/cm$^3$ or more.

* * * * *